US012633443B2

(12) United States Patent
Ji

(10) Patent No.: US 12,633,443 B2
(45) Date of Patent: May 19, 2026

(54) POWER SUPPLY MODULE

(71) Applicant: Delta Electronics (Shanghai) Co., Ltd., Shanghai (CN)

(72) Inventor: Pengkai Ji, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 944 days.

(21) Appl. No.: 17/664,658

(22) Filed: May 24, 2022

(65) Prior Publication Data

US 2022/0392689 A1      Dec. 8, 2022

(30) Foreign Application Priority Data

Jun. 8, 2021      (CN) ......................... 202110637207.X

(51) Int. Cl.
*H01F 27/28* (2006.01)
*H01F 27/26* (2006.01)
(Continued)

(52) U.S. Cl.
CPC ....... *H01F 27/2804* (2013.01); *H01F 27/263* (2013.01); *H01F 37/00* (2013.01); (Continued)

(58) Field of Classification Search
CPC .... H01F 27/2804; H01F 27/263; H01F 37/00; H01F 27/24; H01F 27/28; H01F 27/40; (Continued)

(56) References Cited

U.S. PATENT DOCUMENTS 9,263,177 B1      2/2016  Ikriannikov et al.
2006/0176139 A1   8/2006  Pleskach et al.
(Continued)

FOREIGN PATENT DOCUMENTS

CN      103430256 A      12/2013
CN      103943306 A      7/2014
(Continued)

OTHER PUBLICATIONS

Guangcan Li et al., "A High Power Density 48V-12V DCX with 3-D PCB Winding Transformer", pp. 463-467, IEEE, 2020.

*Primary Examiner* — Shawki S Ismail
*Assistant Examiner* — Kazi S Hossain
(74) *Attorney, Agent, or Firm* — CKC & Partners Co., LLC

(57) ABSTRACT

The disclosure provides a power supply module, including: a pin; a magnetic core including: a first and second magnetic plate arranged in parallel; a first upper wiring layer; a first middle wiring layer; a first lower wiring layer, wherein at least a part of the first upper wiring layer and the first middle wiring layer are connected to form a first winding surrounding the first magnetic plate, at least a part of the first lower wiring layer and the first middle wiring layer are connected to form a second winding surrounding the second magnetic plate. The magnetic core, the first and second winding form a magnetic element electrically connected to a switch. A magnetic loop surrounds a first axis, the first winding surrounds a second axis, the second winding surrounds a third axis, the first, second and third axis are parallel to a plane where the pin is located.

25 Claims, 16 Drawing Sheets

(51) Int. Cl.
    *H01F 37/00*         (2006.01)
    *H02M 1/00*         (2006.01)
    *H02M 3/335*       (2006.01)
    *H05K 1/14*         (2006.01)
    *H05K 1/16*         (2006.01)

(52) U.S. Cl.
    CPC ..... *H02M 1/0064* (2021.05); *H02M 3/33569*
    (2013.01); *H05K 1/141* (2013.01); *H05K*
    *1/165* (2013.01); *H01F 2027/2809* (2013.01)

(58) Field of Classification Search
    CPC ..... H01F 2027/2819; H01F 2027/2809; H01F
        27/292; H02M 1/0064; H02M 3/33576;
        H02M 1/00; H02M 3/003; H02M 3/01;
        H02M 3/33569; H05K 2203/1572; H05K
        3/361; H05K 2201/086; H05K
        2201/10378; H05K 2201/2018; H05K
        1/147; H05K 1/141; H05K 1/165; H01L
        23/645; H01L 2225/06572; H01L 25/0652
    USPC ................................. 336/200, 232, 198, 196
    See application file for complete search history.

(56) References Cited

U.S. PATENT DOCUMENTS

| | | | | |
|---|---|---|---|---|
| 2013/0056847 A1* | 3/2013 | Chen | .................. | H01L 23/5227 |
| | | | | 257/E29.325 |
| 2015/0235753 A1 | 8/2015 | Chatani et al. | | |
| 2017/0084384 A1 | 3/2017 | Otsubo et al. | | |
| 2017/0178794 A1* | 6/2017 | Yan | ......................... | H01F 41/02 |
| 2017/0222563 A1 | 8/2017 | Noma et al. | | |
| 2017/0345756 A1* | 11/2017 | Yin | ..................... | H01L 23/5227 |
| 2019/0333674 A1 | 10/2019 | Quilici | | |
| 2020/0143985 A1* | 5/2020 | Cai | ..................... | H01F 27/2852 |
| 2020/0161042 A1* | 5/2020 | Cai | ..................... | H01F 27/027 |
| 2020/0169181 A1 | 5/2020 | Zhou et al. | | |
| 2020/0260586 A1 | 8/2020 | Hong et al. | | |
| 2021/0005378 A1 | 1/2021 | Hong et al. | | |

FOREIGN PATENT DOCUMENTS

| | | | |
|---|---|---|---|
| CN | 207098945 U | 3/2018 | |
| CN | 110634655 A | 12/2019 | |
| CN | 111145987 A | 5/2020 | |
| CN | 111145988 A | 5/2020 | |
| CN | 111952293 A | 11/2020 | |
| CN | 112530680 A | 3/2021 | |
| GB | 2299714 B | 11/1999 | |
| JP | H0737712 A | 2/1995 | |
| JP | 2016082072 A | 5/2016 | |
| JP | 2017139407 A | 8/2017 | |
| PL | 219054 B1 | 3/2015 | |

* cited by examiner

POWER SUPPLY MODULE

CROSS-REFERENCE TO RELATED APPLICATIONS

This non-provisional application claims priority under 35 U.S.C. § 119(a) on Patent Applications No. 202110637207.X filed in P.R. China on Jun. 8, 2021, the entire contents of which are hereby incorporated by reference.

Some references, if any, which may include patents, patent applications and various publications, may be cited and discussed in the description of this application. The citation and/or discussion of such references, if any, is provided merely to clarify the description of the present application and is not an admission that any such reference is "prior art" to the application described herein. All references listed, cited and/or discussed in this specification are incorporated herein by reference in their entireties and to the same extent as if each reference was individually incorporated by reference.

FIELD

The disclosure relates to the field of power electronic technology, and particularly to a power supply module.

BACKGROUND

Currently, a market size of cloud (data center) and terminal (mobile phone, Pad, etc.) gets larger, and is increasing rapidly. However, it also faces challenges in various aspects. For example, with increasing of functions of various intelligent ICs, power consumption gets larger, devices on a main board also become more, and the power module shall have a higher power density, or a single power module shall have a larger current output capability. Moreover, with improvement of computing capability of the intelligent ICs, the demand for dynamic performance of the power supply system also gets higher. With increasing power of an intelligent accelerator card and a server, a space for the power supply system on the system board is compressed, and the demand for a higher power density, in particular, a smaller height, is proposed for the power supply system. Currently, a planar transformer structure is often used for the transformer based DC-DC conversion power supply module. A magnetic core surrounds along a vertical plane, and a winding surrounds along a horizontal plane, such that the winding of the power supply module is a vertical winding. With a vertical winding, when a height of the module is compressed, the winding is thin, currents in the winding are uneven, and loss of the winding is increased. In addition, the magnetic core is inserted into an inner bore of the winding through assembly, an assembly tolerance is large, structure is not compact, and a footprint is large, causing large loss of the winding or the magnetic core. Alternatively, the transformer can also be formed by way of winding the magnetic core using a copper foil, or by the winding formed by connection of multiple PCBs surrounding the magnetic core. The magnetic core in the power supply module surrounds along the horizontal plane, and the winding surrounds along the vertical plane. When the power supply module is compressed in a height direction, the magnetic core becomes thinner, and the magnetic loop is more uneven, thereby affecting efficiency of the magnetic loop. Furthermore, the foil winding process is complex, position accuracy of the pin is poor, and combination of the transformer and other devices of the power supply module is not flexible. Therefore, it is urgent to develop a new solution capable of solving the problems.

SUMMARY

To solve the above technical problem, the application provides a power supply module, including:

a pin;

a magnetic core, including:

a first magnetic plate; and a second magnetic plate below the first magnetic plate, and parallel to the first magnetic plate, the first magnetic plate and the second magnetic plate forming a magnetic loop;

a first upper wiring layer disposed above the first magnetic plate;

a first middle wiring layer disposed between the first magnetic plate and the second magnetic plate;

a first lower wiring layer disposed below the second magnetic plate, wherein at least a part of the first upper wiring layer and at least a part of the first middle wiring layer are connected to form a first winding surrounding the first magnetic plate, at least a part of the first lower wiring layer and at least a part of the first middle wiring layer are connected to form a second winding surrounding the second magnetic plate, and the magnetic core, the first winding and the second winding form a magnetic element; and a switch electrically connected to the magnetic element, wherein the magnetic loop surrounds a first axis, the first winding surrounds a second axis, the second winding surrounds a third axis, and the first axis, the second axis and the third axis are parallel to a surface of the power module where the pin is located.

In some embodiments, the first winding further includes a first left electrical connection layer and a first right electrical connection layer respectively at left side and right side of the first magnetic plate, the at least a part of the first upper wiring layer, the first left electrical connection layer, the at least a part of the first middle wiring layer and the first right electrical connection layer are sequentially connected to form the first winding, the second winding further includes a second left electrical connection layer and a second right electrical connection layer respectively at left side and right side of the second magnetic plate, and the at least a part of the first middle wiring layer, the second left electrical connection layer, the at least a part of the first lower wiring layer and the second right electrical connection layer are sequentially connected to form the second winding.

In some embodiments, the first left electrical connection layer, the first right electrical connection layer, the second left electrical connection layer and the second right electrical connection layer are conductive vias.

In some embodiments, the first upper wiring layer is disposed on or in a first upper circuit board, the first lower wiring layer is disposed on or in a first lower circuit board, and the first middle wiring layer is disposed on or in a first middle circuit board; the first left electrical connection layer is disposed on or in a first left vertical circuit board, the first right electrical connection layer is disposed on or in a first right vertical circuit board, the second left electrical connection layer is disposed on or in a second left vertical circuit board, the second right electrical connection layer is disposed on or in a second right vertical circuit board, and the first upper circuit board, the first middle circuit board and the first lower circuit board are parallel to the first magnetic plate.

In some embodiments, the first left electrical connection layer and the second left electrical connection layer are disposed on or in a first circuit board, and the first right electrical connection layer and the second right electrical connection layer are disposed on or in a second circuit board.

In some embodiments, the first upper wiring layer, the first left electrical connection layer and the first right electrical connection layer are disposed on or in a third circuit board, the third circuit board has a first groove for accommodating the first magnetic core, the first lower wiring layer, the second left electrical connection layer and the second right electrical connection layer are disposed on or in a fourth circuit board, the fourth circuit board has a second groove for accommodating the second magnetic core, and openings of both the first groove and the second groove face the first middle wiring layer.

In some embodiments, an external surface of the third circuit board and internal surfaces of the first groove and the second groove are electroplated with a metal.

In some embodiments, the first middle wiring layer, the first left electrical connection layer, the first right electrical connection layer, the second left electrical connection layer and the second right electrical connection layer are disposed on or in a fifth circuit board, the fifth circuit board has a third groove and a fourth groove respectively on upper and lower sides of the fifth circuit board, the third groove accommodates the first magnetic core, and the fourth groove accommodates the second magnetic core.

In some embodiments, the first upper wiring layer is disposed on or in a first upper circuit board, the first lower wiring layer is disposed on or in a first lower circuit board, the first middle wiring layer is disposed on or in a first middle circuit board, the first upper circuit board, the first middle circuit board and the first lower circuit board are parallel to the first magnetic plate, and each of the first upper circuit board, the first middle circuit board and the first lower circuit board includes a first end and a second end, the first ends of the first upper circuit board, the first middle circuit board and the first lower circuit board are aligned with each other, the second ends of the first upper circuit board, the first middle circuit board and the first lower circuit board are aligned with each other, the first left electrical connection layer and the second left electrical connection layer are disposed on or in a first circuit board in contact with the first ends of the first upper circuit board, the first middle circuit board and the first lower circuit board, and the first right electrical connection layer and the second right electrical connection layer are disposed on or in a second circuit board in contact with the second ends of the first upper circuit board, the first middle circuit board and the first lower circuit board.

In some embodiments, both ends of the first middle circuit board protrude out of the first left vertical circuit board and the first right vertical circuit board, respectively, and the pin is disposed on a lower surface of both ends of the first middle circuit board, or the pin is formed on a lower surface of a copper block disposed on a lower surface of both ends of the first middle circuit board.

In some embodiments, both ends of the first middle circuit board protrude out of the first left vertical circuit board and the first right vertical circuit board, respectively, the pin is disposed on a lower surface of both ends of the first middle circuit board, a load is disposed on a system board, the power supply module is configured to power the load, and the system board is provided with a through groove into which the second left vertical circuit board, the second right vertical circuit board and the second magnetic plate are embedded, and the first middle circuit board is electrically connected to the system board.

In some embodiments, the magnetic core further includes a first magnetic cover, a second magnetic cover, a third magnetic cover and a fourth magnetic cover, the first magnetic cover and the second magnetic cover are disposed respectively on a front side surface and a rear side surface of the first magnetic plate, the third magnetic cover and the fourth magnetic cover are disposed respectively on a front side surface and a rear side surface of the second magnetic plate, end surfaces of the first magnetic cover, the second magnetic cover, the third magnetic cover and the fourth magnetic cover are inclined surfaces, an inclined first air gap is formed between the first magnetic cover and the third magnetic cover, and an inclined second air gap is formed between the second magnetic cover and the fourth magnetic cover.

In some embodiments, the magnetic core further includes a third magnetic plate and a fourth magnetic plate stacked, the third magnetic plate and the fourth magnetic plate are at right side of the first magnetic plate and the second magnetic plate, and the power supply module further includes:

a second upper wiring layer disposed above the third magnetic plate;

a second middle wiring layer disposed between the third magnetic plate and the fourth magnetic plate; and a second lower wiring layer disposed below the fourth magnetic plate, wherein at least a part of the second upper wiring layer and at least a part of the second middle wiring layer are connected to form a third winding surrounding the third magnetic plate, at least a part of the second lower wiring layer and at least a part of the second middle wiring layer are connected to form a fourth winding surrounding the fourth magnetic plate, the third winding surrounds a fourth axis, the fourth winding surrounds a fifth axis, and the fourth axis and the fifth axis are parallel to the surface of the power module where the pin is located.

In some embodiments, the third winding further includes a third left electrical connection layer and a third right electrical connection layer respectively at left and right sides of the third magnetic plate, the at least a part of the second upper wiring layer, the third left electrical connection layer, the at least a part of the second middle wiring layer and the third right electrical connection layer are sequentially connected to form the third winding, the fourth winding further includes a fourth left electrical connection layer and a fourth right electrical connection layer respectively at left and right sides of the fourth magnetic plate, and the at least a part of the second middle wiring layer, the fourth left electrical connection layer, the at least a part of the second lower wiring layer and the fourth right electrical connection layer are sequentially connected to form the fourth winding.

In some embodiments, the second upper wiring layer is formed on or in a second upper circuit board, the second lower wiring layer is formed on or in a second lower circuit board, and the second middle wiring layer is formed on or in a second middle circuit board; the third left electrical connection layer is formed on or in a third left vertical circuit board, the third right electrical connection layer is formed on or in a third right vertical circuit board, the fourth left electrical connection layer is formed on or in a fourth left vertical circuit board, and the fourth right electrical connection layer is formed on or in a fourth right vertical circuit board.

In some embodiments, the first left electrical connection layer and the second left electrical connection layer are disposed on or in a first circuit board, the first right electrical connection layer and the second right electrical connection layer are disposed on or in a second circuit board, the third left electrical connection layer and the fourth left electrical connection layer are disposed on or in a sixth circuit board, and the third right electrical connection layer and the fourth right electrical connection layer are disposed on or in a seventh circuit board.

In some embodiments, the first right electrical connection layer and the third left electrical connection layer are disposed on or in an eighth circuit board, and the second right electrical connection layer and the fourth left electrical connection layer are disposed on or in a ninth circuit board.

In some embodiments, the first right electrical connection layer, the second right electrical connection layer, the third left electrical connection layer and the fourth left electrical connection layer are disposed on or in a tenth circuit board.

In some embodiments, the first left electrical connection layer, the first left electrical connection layer, the first upper wiring layer, the first right electrical connection layer, the third left electrical connection layer, the second upper wiring layer and the third right electrical connection layer are disposed on or in an eleventh circuit board, the second left electrical connection layer, the first lower wiring layer, the second right electrical connection layer, the fourth left electrical connection layer, the second lower wiring layer and the fourth right electrical connection layer are disposed on or in a twelfth circuit board, and the first middle wiring layer and the second middle wiring layer are disposed on or in a thirteenth circuit board.

In some embodiments, the first upper wiring layer and the second upper wiring layer are disposed on or in a fourteenth circuit board, the first left electrical connection layer, the first right electrical connection layer, the second left electrical connection layer, the second right electrical connection layer, the third left electrical connection layer, the third right electrical connection layer, the fourth left electrical connection layer, the fourth right electrical connection layer, the first middle wiring layer and the second middle wiring layer are disposed on or in a fifteenth circuit board, and the first lower wiring layer and the second lower wiring layer are disposed on or in a sixteenth circuit board.

In some embodiments, the first upper circuit board, the first left vertical circuit board and the first right vertical circuit board are integrated into a flexible circuit board; and the first lower circuit board, the second left vertical circuit board and the second right vertical circuit board are integrated into another flexible circuit board.

In some embodiments, the first upper wiring layer and the first middle wiring layer both have multiple layers, at least a part of the first upper wiring layer and at least a part of the first middle wiring layer are connected to form a fifth winding, the first winding is a primary winding of the magnetic element, and the fifth winding is a first secondary winding of the magnetic element.

In some embodiments, at least a part of the first upper wiring layer and at least a part of the first middle wiring layer are connected to form a sixth winding, the sixth winding is a second secondary winding of the magnetic element, and at least a part of the primary winding is between at least a part of the first secondary winding and at least a part of the second secondary winding.

In some embodiments, the first upper wiring layer, the first left electrical connection layer and the first right electrical connection layer are disposed on or in a third circuit board, the third circuit board has a first groove for accommodating the first magnetic core, and an external surface of the third circuit board and an internal surface of the groove are electroplated with a metal.

The disclosure further provides a power supply module, including:
a plurality of pins;
a magnetic core, including:
a first magnetic plate; and
a second magnetic plate below the first magnetic plate, and parallel to the first magnetic plate, the first magnetic plate and the second magnetic plate forming a magnetic loop;
a first upper wiring layer disposed above the first magnetic plate;
a first middle wiring layer disposed between the first magnetic plate and the second magnetic plate;
a first lower wiring layer disposed below the second magnetic plate, wherein at least a part of the first upper wiring layer and at least a part of the first middle wiring layer are connected to form a first winding surrounding the first magnetic plate, at least a part of the first lower wiring layer and at least a part of the first middle wiring layer are connected to form a second winding surrounding the second magnetic plate, and the magnetic core, the first winding and the second winding form a magnetic element; and
a switch electrically connected to the magnetic element, wherein the magnetic loop surrounds a first axis, the first winding surrounds a second axis, the second winding surrounds a third axis, the first axis, the second axis and the third axis are parallel to a plane where centers of the plurality of pins are located, the middle wiring layer is disposed on or in a first middle circuit board, and the plurality of pins are disposed on both inclined end surfaces of the first middle circuit board.

DETAILED DESCRIPTION

Figure 1:
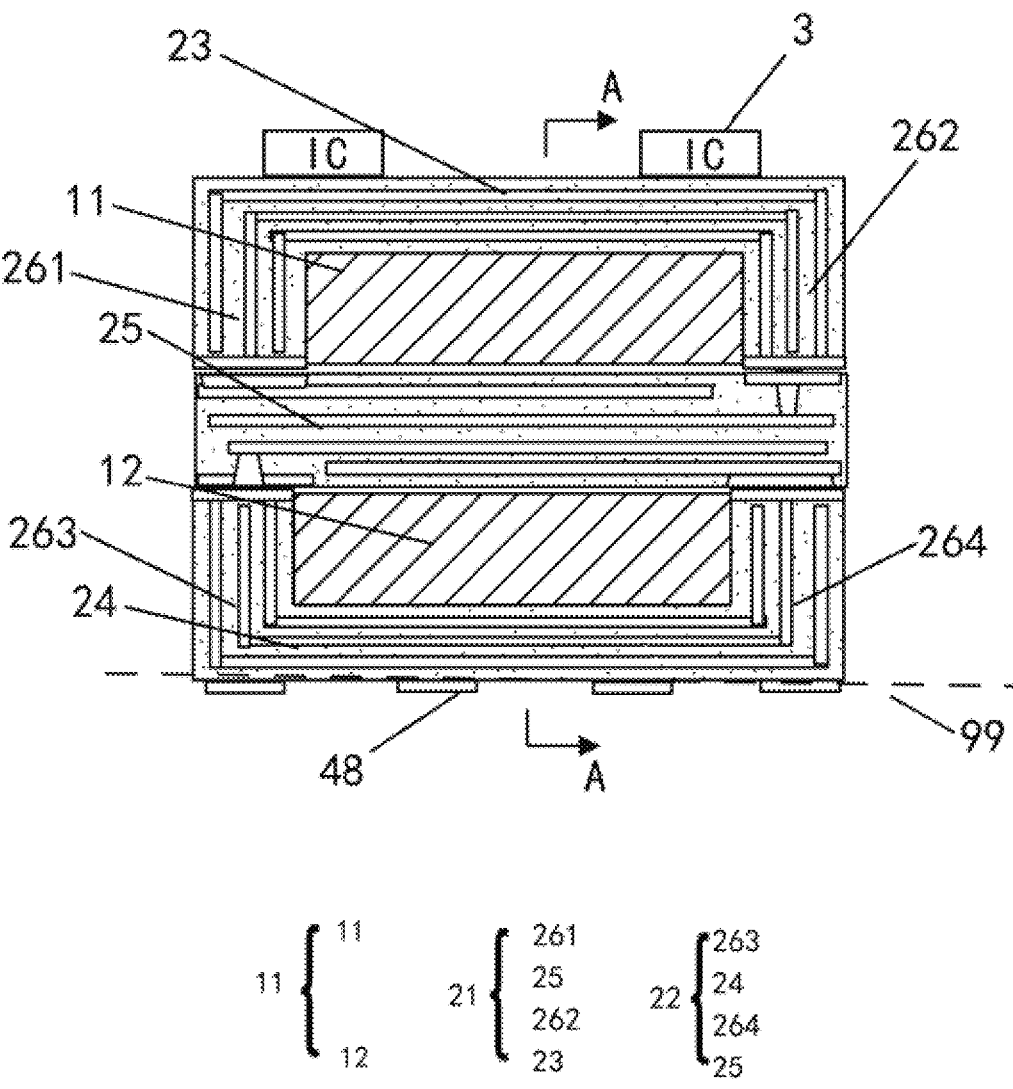
FIG. 1 is a schematic structural view (I) of a power supply module in a first embodiment of the disclosure.
Figure 2:
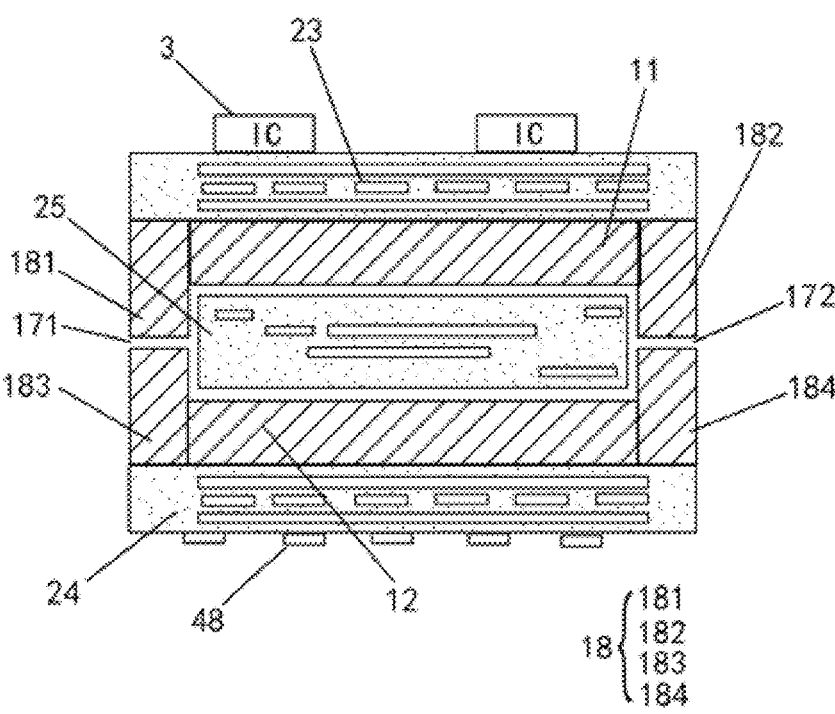
FIG. 2 is a schematic structural view (II) of the power supply module in the first embodiment of the disclosure.
Figure 3:
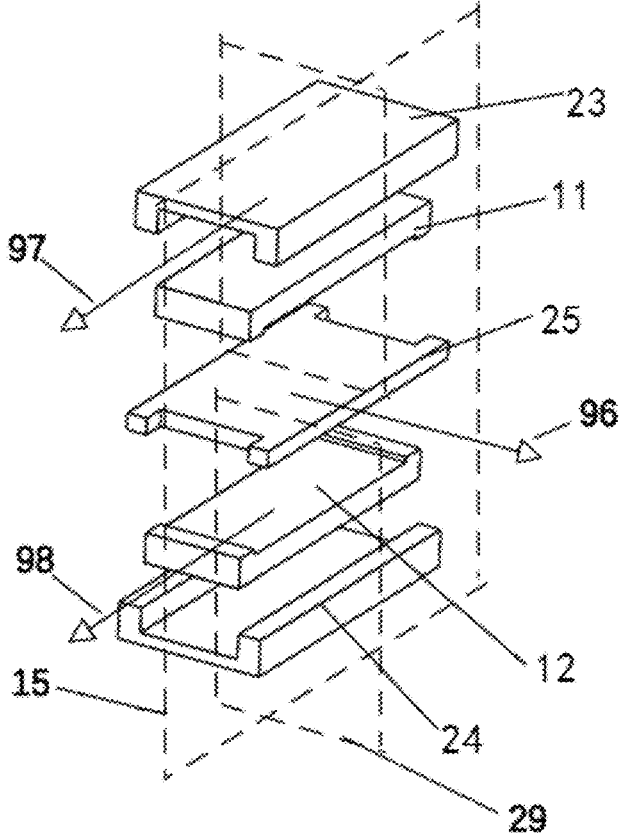
FIG. 3 is a perspective structural view of the power supply module in the first embodiment of the disclosure.

Please refer to FIGS. 1 to 3. FIG. 1 is a schematic structural view of a power supply module in a first embodiment of the disclosure, FIG. 2 is a cross-section view of the power supply module along A-A in FIG. 1, and FIG. 3 is a perspective structural view of the power supply module in the first embodiment of the disclosure.

The power supply module includes a pin 48, a magnetic core 1, a first upper wiring layer 23, a first middle wiring layer 25, a first lower wiring layer 24 and a switch 3 (maybe switching device, active device, such as MOS). The magnetic core 1 includes a first magnetic plate 11, and a second magnetic plate 12 parallel to the first magnetic plate 11, and the first magnetic plate 11 and the second magnetic plate 12 form a magnetic loop 15. The first upper wiring layer 23 is disposed above the first magnetic plate 11, the first middle wiring layer 25 is disposed between the first magnetic plate 11 and the second magnetic plate 12, and the first lower wiring layer 24 is disposed below the second magnetic plate 12. At least a part of the first upper wiring layer 23 and at least a part of the first middle wiring layer 25 are connected to form a first winding 21 surrounding the first magnetic plate 11, and at least a part of the first lower wiring layer 24 and at least a part of the first middle wiring layer 25 are connected to form a second winding 22 surrounding the second magnetic plate 12. The magnetic core 1, the first winding 21 and the second winding 22 form a magnetic element. The switch 3 is electrically connected to the magnetic element to form the power supply module. The magnetic loop 15 surrounds a first axis 96, the first winding 21 surrounds a second axis 97, the second winding 22 surrounds a third axis 98, and the third axis 98 or the second axis 97 is perpendicular to the first axis 96. The first axis 96, the second axis 97 and the third axis 98 are parallel to a surface of the power module where the pin 48 is located.

The first winding 21 further includes a first left electrical connection layer 261 and a first right electrical connection layer 262 respectively at left side and right side of the first magnetic plate 11. The second winding 22 further includes a second left electrical connection layer 263 and a second right electrical connection layer 264 respectively at left side and right side of the second magnetic plate 12. The at least a part of the first upper wiring layer 23, the first left electrical connection layer 261, the at least a part of the first middle wiring layer 25 and the first right electrical connection layer 262 are sequentially connected to form the first winding 21. The at least a part of the first middle wiring layer 25, the second left electrical connection layer 263, the at least a part of the first lower wiring layer 24 and the second right electrical connection layer 264 are sequentially connected to form the second winding 22. The first left electrical connection layer 261, the first right electrical connection layer 262, the second left electrical connection layer 263 and the second right electrical connection layer 264 are conductive vias.

In addition, referring to FIGS. 2 and 3, the magnetic core further includes a magnetic cover 18, including a first magnetic cover 181, a second magnetic cover 182, a third magnetic cover 183 and a fourth magnetic cover 184. The first magnetic cover 181 and the second magnetic cover 182 are disposed respectively on a front side surface and a rear side surface of the first magnetic plate, and the third magnetic cover 183 and the fourth magnetic cover 184 are disposed respectively on a front side surface and a rear side surface of the second magnetic plate 12. The first magnetic plate 11, the second magnetic plate 12 and the first to fourth magnetic covers (181 to 184) form the magnetic loop 15. Air gaps can be disposed on the magnetic cover 18. For example, as shown in FIG. 2, a first air gap 171 is formed between the first magnetic cover 181 and the third magnetic cover 183, and a second air gap 172 is formed between the second magnetic cover 182 and the fourth magnetic cover 184. The first magnetic cover 181, the second magnetic cover 182 and the first magnetic plate 11 are formed integrally or separately, and the third magnetic cover 183, the fourth magnetic cover 184 and the second magnetic plate 12 are formed integrally or separately.

When the power supply module is installed on the customer's system board, the height of the power supply module is often greatly limited, and it is desired that the smaller the height is, the better it will be. Moreover, when the power supply module of the disclosure is compressed along the height direction, the first magnetic plate 11 or the second magnetic plate 12 can be compressed, such that they become thinner, and in the case of the same sectional area (an AE value) of the magnetic loop, a magnetic flux of the magnetic loop 15 is more even. Similarly, the first upper wiring layer 23, the first lower wiring layer 24 and the first middle wiring layer 25 can be compressed and become thinner, and in the case of the same sectional area (an AE value) of the winding, a current of a winding loop 29 is more even. The even magnetic loop and the winding loop facilitate improving efficiency of the power supply module. Moreover, it is easy for the primary winding and the secondary winding to form a stacked structure, and parasitic inductance therebetween is smaller. Alternating currents in the winding are concentrated to a conductor surface due to proximity effect and skin effect. Through thinning of the winding and stacking of the layers, currents can be distributed on both surfaces of the winding. Therefore, Utilization of a current through the winding is higher, which better facilitates efficiency of a high frequency power supply module. In addition, the first winding and the second winding are with a stacked structure, so arrangement of the switching device and the winding is more flexible, which better facilitates reducing footprint of the power supply module, and realizing a high power density.

Figure 4:
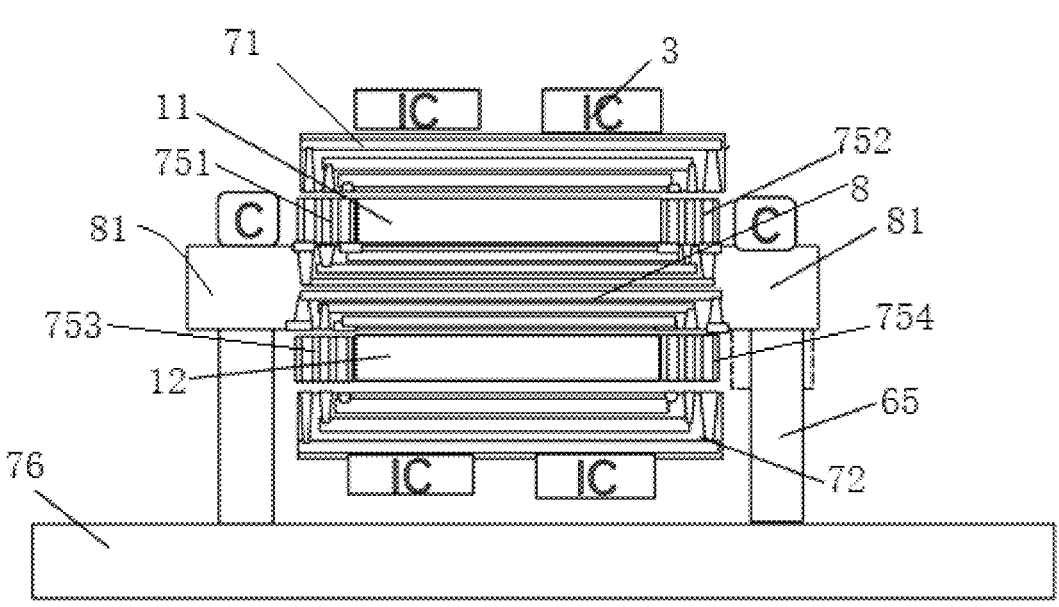
FIG. 4 is a schematic structural view (I) of a power supply module in a second embodiment of the disclosure.

Referring to FIG. 4 and FIG. 1, FIG. 4 is a schematic structural view (I) of a power supply module in a second embodiment of the disclosure. In this embodiment, the power supply module is similar with the power supply module of FIG. 1, and the same reference numerical indicates the same component, structure and function, so the details are not described here. This embodiment differs from the first embodiment in that the first upper wiring layer 23, the first middle wiring layer 25, the first lower wiring layer 24 and the electrical connection layers are disposed on or in the circuit boards. Specifically, the first upper wiring layer 23 is disposed on or in a first upper circuit board 71, the first lower wiring layer 24 is disposed on or in a first lower circuit board 72, and the first middle wiring layer 25 is disposed on or in a first middle circuit board 8. The first left electrical connection layer 261 is disposed on or in a first left vertical circuit board 751, the first right electrical connection layer 262 is disposed on or in a first right vertical circuit board 752, the second left electrical connection layer 263 is disposed on or in a second left vertical circuit board 753, the second right electrical connection layer 264 is disposed on or in a second right vertical circuit board 754, and the first upper circuit board 71, the first middle circuit board 8 and the first lower circuit board 72 are parallel to the first magnetic plate 11. At least one of the first upper circuit board 71, the first middle circuit board 8, the first lower circuit board 72, the first left vertical circuit board 751, the first right vertical circuit board 752, the second left vertical circuit board 753 and the second right vertical circuit board 754 is provided with a switching device 3, and the switching device 3 can be a secondary rectifier device of the transformer.

Referring to FIG. 4, both ends of the first middle circuit board 8 protrude out of the first left vertical circuit board 751 and the first right vertical circuit board 752, respectively, and a portion at one end of the first middle circuit board 8 protruding out of the first left vertical circuit board 751 form a protruding section 81, and a portion at another end of the first middle circuit board 8 protruding out of the first right vertical circuit board 752 form another protruding section 81. The pin is disposed on a lower surface of the first middle circuit board 8, and located on the protruding section 81 of the first middle circuit board 8. A copper block 65 can be used as the pin. For example, in the figure, the first middle circuit board 8 is connected to a system circuit board 76 with the copper block 65, a lower surface of the copper block 65 functions as the pin of the power supply module, and a surface of the power module where the pin is located is parallel to a horizontal plane. The horizontal plane refers to a plane parallel to a surface of the system circuit board 76. The pin (e.g., the soldering pad) of the power supply module is disposed on both sides of the first middle circuit board 8, such that outputs of the first winding 21 and the second winding 22 are symmetric, so as to facilitate improving power and efficiency of the power supply module. Moreover, the structure is compact, and power density is high.

Figure 5:
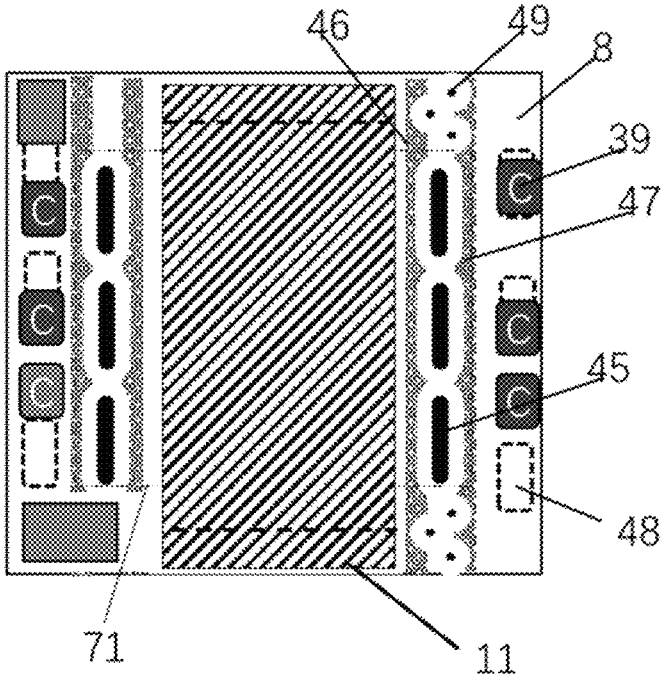
FIG. 5 is a side view of FIG. 4.

FIG. 5 is a side view of FIG. 4. To simplify illustration, the vertical circuit boards are removed, and the first upper circuit board 71 is shown by a double dot dash line box. In this embodiment, the first upper wiring layer 23, the first middle wiring layer 25 and the first lower wiring layer 24 all include three wiring layers. Combining with FIG. 1 or 4, FIG. 5 illustrates that capacitors 39 can also be disposed on the first middle circuit board 8. In addition, FIG. 5 also illustrates that other switching device 3a (e.g., a driver, or a primary switch) or a controller 38 can also be disposed in a region of the protruding section 81. In such way, the structure is compact, and a space utility rate is high.

Figure 6:
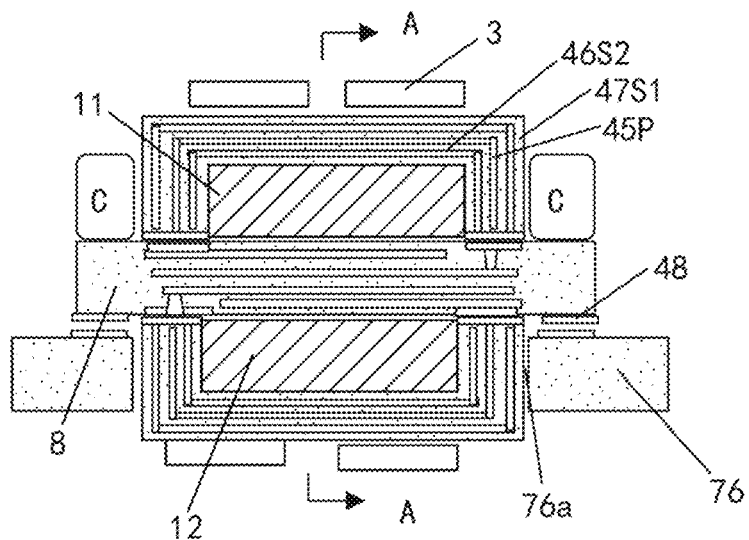
FIG. 6 is a schematic structural view (II) of the power supply module in the second embodiment of the disclosure.

Still further, referring to FIG. 6 and FIG. 4, FIG. 6 is a schematic structural view (II) of the power supply module in the second embodiment of the disclosure. As shown in FIG. 6, a lower half part of the power supply module is embedded into the system circuit board 76. The system circuit board 76 is provided with a through groove 76a into which the second left vertical circuit board 753, the second right vertical circuit board 754 and the second magnetic plate 12 are embedded. Both ends of the first middle circuit board 8 protrude out of the first left vertical circuit board 751 and the first right vertical circuit board 752 respectively. The pin 48 is disposed on a lower surface of both ends of the first middle circuit board 8. A load (not shown) is disposed on the system circuit board 76, and the power supply module is configured to power the load. The pin 48 (e.g., the soldering pad) of the power supply module on the first middle circuit board 8 is soldered to the corresponding soldering pad on the system circuit board 76, such that the first middle circuit board 8 is electrically connected to the system circuit board 76. As compared to FIG. 4, it is unnecessary to use the copper block 65 in this embodiment, such that the structure is simpler, the number of components is reduced, and an output path is shorter and symmetric. Cost can be reduced, and efficiency of the power supply module can also be improved. Moreover, a height of the power supply module on the customer's system circuit board 76 can be largely reduced, thereby facilitating expanding application.

Figure 7:
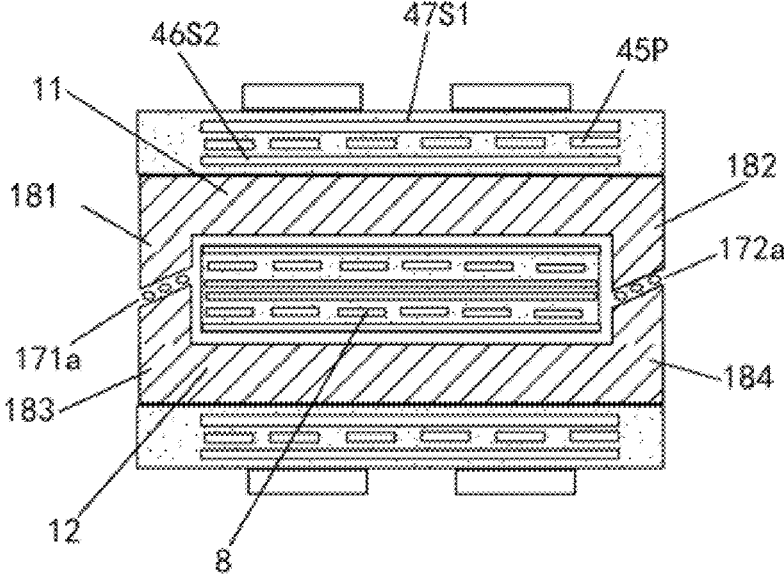
FIG. 7 is a cross-section view along AA in FIG. 6.

FIG. 7 is a cross-section view along A-A in FIG. 6. In FIGS. 6 and 7, the first upper wiring layer and the first middle wiring layer both include three layers. At least a part of the first upper wiring layer and at least a part of the first middle wiring layer are connected to form a fifth winding. The first winding can be a primary winding 45P of the magnetic element, and the fifth winding can be a first secondary winding 47S1 of the magnetic element. At least a part of the first upper wiring layer and at least a part of the first middle wiring layer are connected to form a sixth winding. The sixth winding can be a second secondary winding 46S2 of the magnetic element. And at least a part of the primary winding 45P is between at least a part of the first secondary winding 47S1 and at least a part of the second secondary winding 46S2.

Referring to FIG. 5 again, in FIG. 5, a terminal 45 of the primary winding 45P, a terminal 47 of the first secondary winding 47S1 and a terminal 46 of the second secondary winding 46S2 are disposed on the first middle circuit board 8. An output pin 48 (e.g., a soldering pad) and a signal terminal 49 are also disposed on the first middle circuit board 8. The winding below the first middle circuit board 8 can also be formed in a similar way.

Referring to FIG. 7, in this embodiment, the first magnetic plate 11 and the second magnetic plate 12 are connected to form a complete magnetic loop through an air gap. End surfaces of the first magnetic cover 181, the second magnetic cover 182, the third magnetic cover 183 and the fourth magnetic cover 184 are inclined surfaces. An inclined first air gap 171a is formed between the first magnetic cover 181 and the third magnetic cover 183, and an inclined second air gap 172a is formed between the second magnetic cover 182 and the fourth magnetic cover 184, such that a lower surface of the first magnetic plate 11 can contact and abut against an upper surface of the first middle circuit board 8, and an upper surface of the second magnetic plate 12 can contact and abut against a lower surface of the first middle circuit board 8. When the first magnetic plate 11 and the second magnetic plate 12 form a magnetic loop, if sizes of the first air gap and the second air gap (171*a*, 172*a*) do not meet expectations due to a thickness tolerance or other tolerance of the first middle circuit board 8, the sizes can be adjusted by slightly adjusting a position of the first magnetic plate 11 or the second magnetic plate 12 in a horizontal direction. For example, if the air gaps are smaller than expected, the first magnetic plate 11 can be shifted to left, and if the air gaps are larger than expected, the first magnetic plate 11 can be shifted to right. With such structure the first air gap and the second air gap (171*a*, 172*a*) can be flexibly adjusted in the case of ensuring the first magnetic plate 11, the middle circuit board 8 and the second magnetic plate 12 to be closely installed together, such that the height of the power supply module can be reduced, and the air gaps of the magnetic loop can also be adjusted conveniently.

Figure 8:
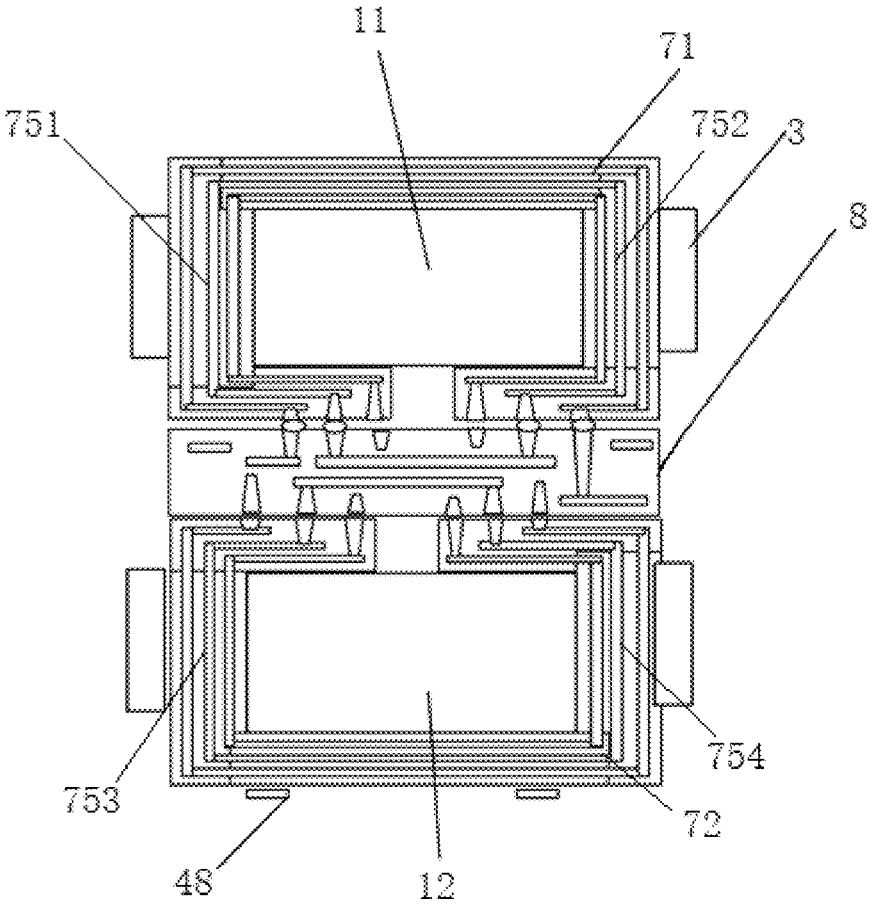
FIG. 8 is a schematic structural view (I) of a power supply module using a flexible circuit board.
Figure 9A:
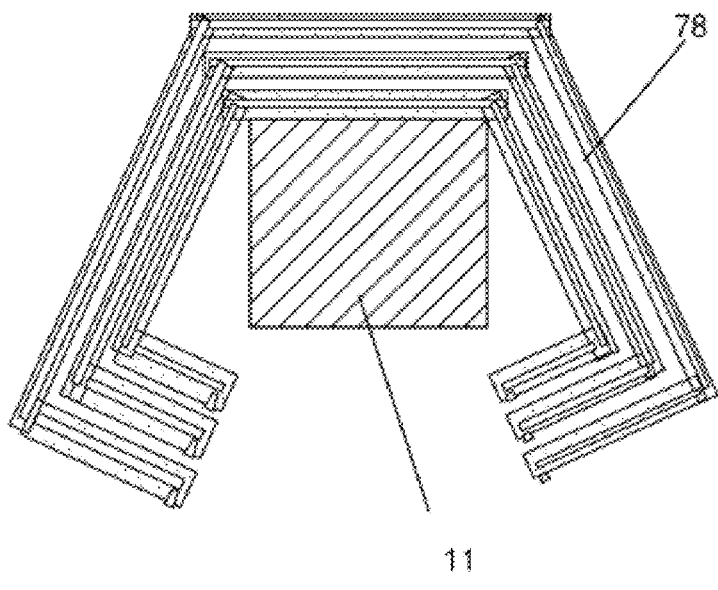
FIG. 9a is a schematic structural view (I) of the flexible circuit board.
Figure 9B:
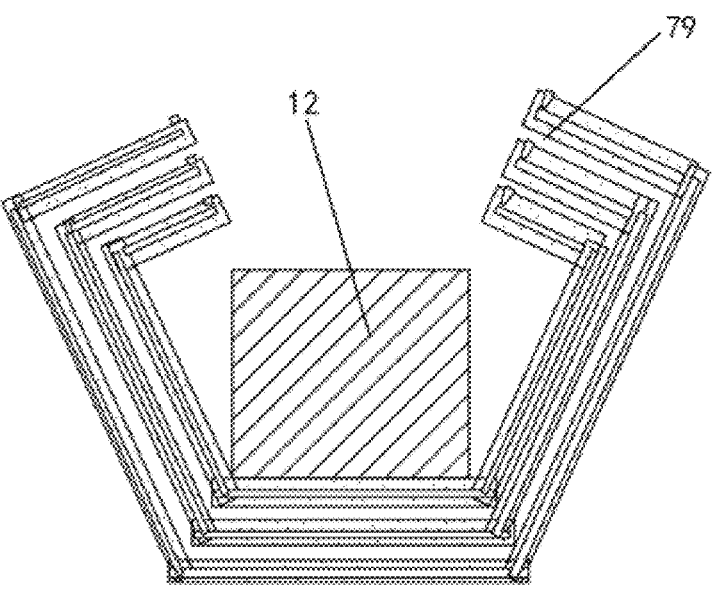
FIG. 9b is a schematic structural view (II) of the flexible circuit board.

Referring to FIG. 8, FIG. 8 is a schematic structural view (I) of a power supply module using a flexible circuit board, FIG. 9*a* is a schematic structural view (I) of the flexible circuit board, and FIG. 9*b* is a schematic structural view (II) of the flexible circuit board. The first upper circuit board 71, the first left vertical circuit board 751 and the first right vertical circuit board 752 are integrated into flexible circuit board 78, and the first lower circuit board 72, the second left vertical circuit board 753 and the second right vertical circuit board 754 are integrated into flexible circuit board 79. Three-quarter of the windings uses the flexible circuit boards. For example, the windings along three side surfaces use the flexible circuit boards, and the remaining quarter of the windings (the winding on the fourth side surface) is formed by the first middle circuit board 8. Pins 48 (e.g., soldering pads) can also be disposed on the flexible circuit board 78. Of course, both sides of the first middle circuit board 8 can also extend out to dispose the pins 48 such as the copper block. Switching devices 3 can be disposed on the flexible circuit board 78. FIG. 9*a* illustrates a schematic diagram wherein the multi-layer flexible circuit board 78 wraps the first magnetic plate 11. The flexible circuit board 78 can be shaped first, then the first magnetic plate 11 is inserted, or the flexible circuit board 78 can also be directly winded around the first magnetic plate 11. Similarly, as shown in FIG. 9*b*, the flexible circuit board 79 is winded around the second magnetic plate 12. The first middle circuit board 8 is disposed between the first magnetic plate 11 and the second magnetic plate 12 to form the power supply module, such that the structure is simple and compact, and is easy to manufacture.

Figure 10:
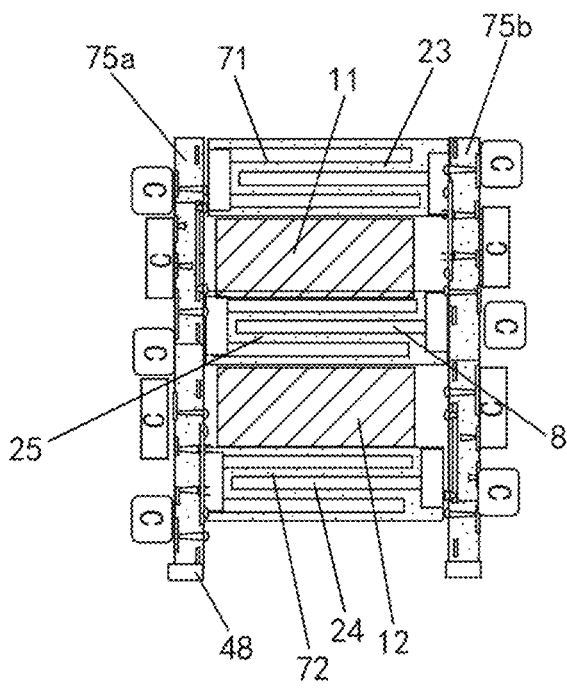
FIG. 10 is a schematic structural view of a power supply module in a third embodiment of the disclosure.
Figure 11:
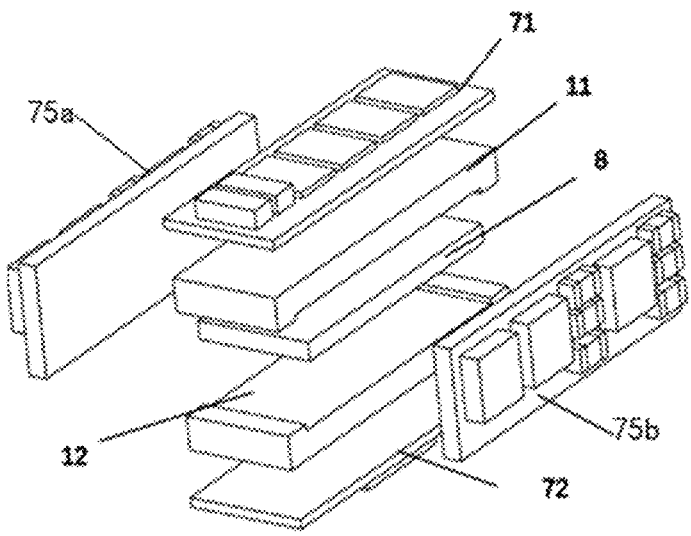
FIG. 11 is a perspective structural view of the power supply module in the third embodiment of the disclosure.
Figure 12:
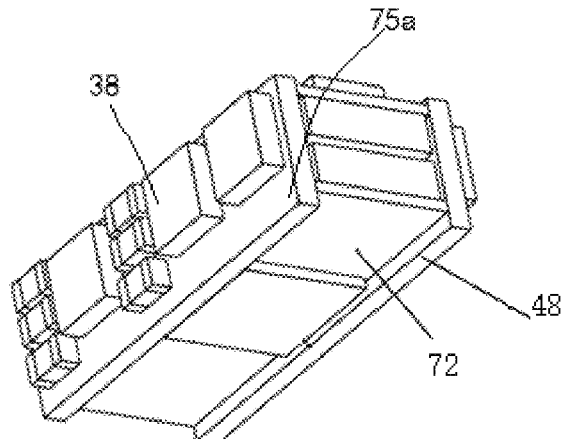
FIG. 12 is an explosion view of FIG. 11.

Referring to FIGS. 10 to 12, FIG. 10 is a schematic structural view of a power supply module in a third embodiment of the disclosure, FIG. 11 is a perspective structural view of the power supply module in the third embodiment of the disclosure, and FIG. 12 is an explosion view of FIG. 11. In this embodiment, the power supply module is similar with the power supply modules provided in the above embodiments, and the same reference numerical indicates the same component, structure and function, so the details are not described here. In this embodiment, the first upper wiring layer 23, the first magnetic plate 11, the first middle wiring layer 25, the second magnetic plate 12 and the first lower wiring layer 24 are stacked sequentially from up to down. The first upper circuit board 71, the first middle circuit board 8 and the first lower circuit board 72 are parallel to the first magnetic plate 11. Each of the first upper circuit board 71, the first middle circuit board 8 and the first lower circuit board 72 includes a first end and a second end.

The first ends of the first upper circuit board 71, the first middle circuit board 8 and the first lower circuit board 72 are aligned with each other, and the second ends of the first upper circuit board 71, the first middle circuit board 8 and the first lower circuit board 72 are aligned with each other. In addition to disposing the electrical connection layers on side surface on four vertical circuit boards, the first left electrical connection layer 261 and the second left electrical connection layer 263 can also be disposed on or in a first circuit board 75*a* in contact with the first ends of the first upper circuit board 71, the first middle circuit board 8 and the first lower circuit board 72. The first right electrical connection layer 262 and the second right electrical connection layer 264 are disposed on or in a second circuit board 75*b* in contact with the second ends of the first upper circuit board 71, the first middle circuit board 8 and the first lower circuit board 72. The first upper wiring layer 23, the first middle wiring layer 25, the first lower wiring layer 24 and the electrical connection layers on the side surfaces are disposed on or in the circuit boards, such that the wiring layers and the electrical connection layers on the side surfaces are realized conveniently, and the switching devices are arranged conveniently. For example, the switching devices not only can be disposed on or in the first upper circuit board 71, the first lower circuit board 72 and the first middle circuit board 8, but also can be disposed on or in the first circuit board 75*a* and the second circuit board 75*b*. The pins 48 of the power supply module can also be disposed on or in upper and lower end surfaces of the first circuit board 75*a* and the second circuit board 75*b*, such that the first winding and the second winding can be symmetric to facilitate improving efficiency of the power supply module.

Please refer to FIGS. 11 and 12 simultaneously. FIG. 11 illustrates that devices can also be disposed on an upper surface of the first upper circuit board 71. In this embodiment, the first left electrical connection layer 261 and the second left electrical connection layer 262 are disposed on or in a first circuit board 75*a*, and the first upper circuit board 71 and the first lower circuit board 72 are electrically connected via their end surfaces to a surface of the first circuit board 75*a* facing the magnetic core, such that one surface of the first circuit board 75*a* away from the magnetic core becomes larger and complete to better facilitate disposing and arranging the devices (such as controllers 38) on the first circuit board 75*a*. The soldering pads (such as, the pins 48) can also be directly disposed on a surface of the first circuit board 75*a*, such that the pins of the power supply module are arranged more conveniently and flexible, and the switching devices are arranged more flexible. Moreover, the entire structure is compact, and the process is simple.

Figure 13:
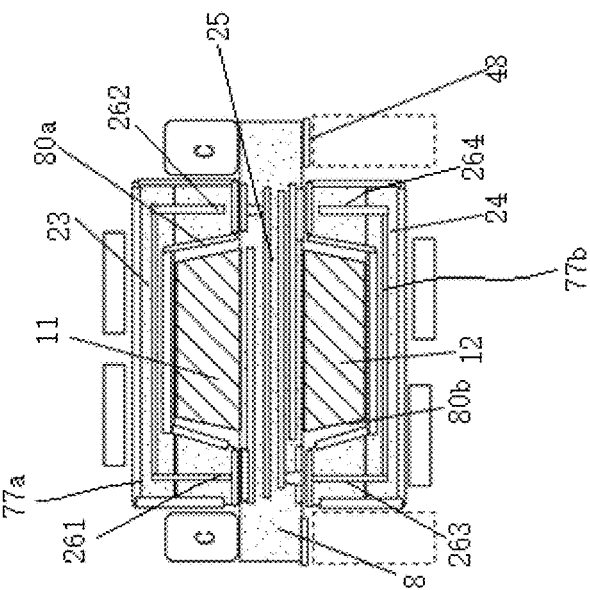
FIG. 13 is a schematic structural view of a power supply module in a fourth embodiment of the disclosure.

Referring to FIG. 13, FIG. 13 is a schematic structural view of a power supply module in a fourth embodiment of the disclosure. In this embodiment, the power supply module is similar with the power supply modules provided in the above embodiments, and the same reference numerical indicates the same component, structure and function, so the details are not described here. This embodiment differs from the second embodiment in that the first upper wiring layer 23, the first left electrical connection layer 261 and the first right electrical connection layer 262 are disposed on or in a third circuit board 77*a*. The third circuit board 77*a* has a first groove 80*a* for accommodating the first magnetic plate 11. The first lower wiring layer 24, the second left electrical connection layer 263 and the second right electrical connection layer 264 are disposed on or in a fourth circuit board 77*b*. The fourth circuit board 77*b* has a second groove 80*b* for accommodating the second magnetic plate 12. Openings of the first groove 80a and the second groove 80b face the first middle wiring layer 25. An external surface of the third circuit board 77a and an internal surface of the groove 80a can be electroplated with a metal.

Figure 14:
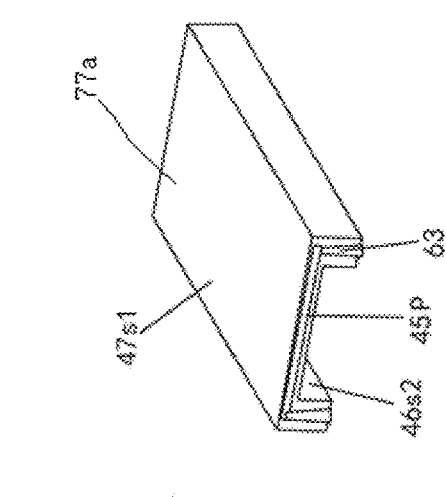
FIG. 14 is a perspective structural view of a third circuit board in the fourth embodiment of the disclosure.

Referring to FIGS. 13 and 14 simultaneously, FIG. 14 is a perspective structural view of the third circuit board 77a in the fourth embodiment of the disclosure. The first groove 80a and the second groove 80b may be square grooves, or trapezoidal grooves. For example, when the first groove 80a and the second groove 80b are trapezoidal grooves, a width of the opening is larger than a width of a bottom. An external surface of the third circuit board 77a and internal surfaces of the first groove 80a and the second groove 80b can be electroplated with a metal.

The third circuit board 77a may have a plurality of wiring layers, and as shown in FIG. 14, the third circuit board 77a has three wiring layers, which are an external wiring layer, an internal wiring layer and a middle wiring layer, respectively. The external wiring layer and the internal wiring layer may be formed by electroplating. At least a part of the middle wiring layer can be formed as a part of the primary winding 45P of the transformer, at least a part of the external wiring layer can be formed as a part of the first secondary winding 47S1 of the transformer, and at least a part of the internal wiring layer can be formed as a part of the second secondary winding 46S2 of the transformer. Similarly, the fourth circuit board 77b and the third circuit board 77a have the same structure of wiring layers, so the details are not described here.

Figure 15:
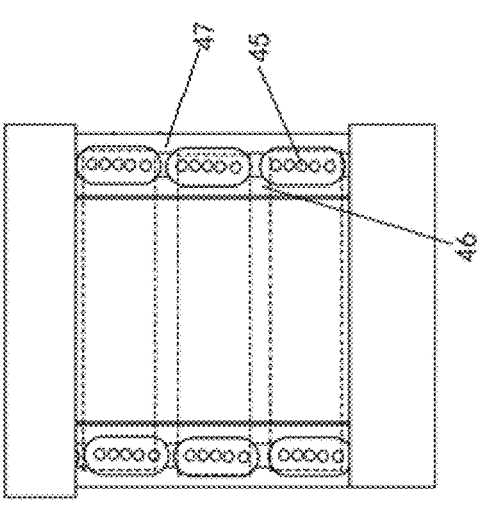
FIG. 15 is a projection view of the third circuit board in the fourth embodiment of the disclosure.

Referring to FIG. 15, FIG. 15 is a bottom view of the third circuit board 77a in the fourth embodiment of the disclosure. Both sides of the first groove 80a of the third circuit board 77a are disposed with a terminal 45 of the primary winding, a terminal 47 of the first secondary winding and a terminal 46 of the second secondary winding. Referring to FIG. 13 again, terminals are disposed on or in the first middle circuit board 8 at positions corresponding to the terminal 45 of the primary winding, the terminal 47 of the first secondary winding and the terminal 46 of the second secondary winding. The third circuit board 77a is connected to the corresponding terminals on the first middle circuit board 8 through the terminal 45 of the primary winding, the terminal 47 of the first secondary winding and the terminal 46 of the second secondary winding to form a complete first winding 21. Similarly, the fourth circuit board 77b and the first middle circuit board 8 can also be connected in the same manner to form the second winding 22. Both ends of the first middle circuit board 8 protrude out of the third circuit board 77a and the fourth circuit board 77b, so the pins 48 can be disposed at a protruding position. The windings are formed by electroplating the surfaces of the circuit boards, and a fit clearance is reduced through the trapezoidal grooves, such that structure of the windings is compact, and parasitic inductance is small. Panel automatic production can be used for the third circuit board 77a, the fourth circuit board 77b and the first middle circuit board 8, and the process is simple.

Figure 16:
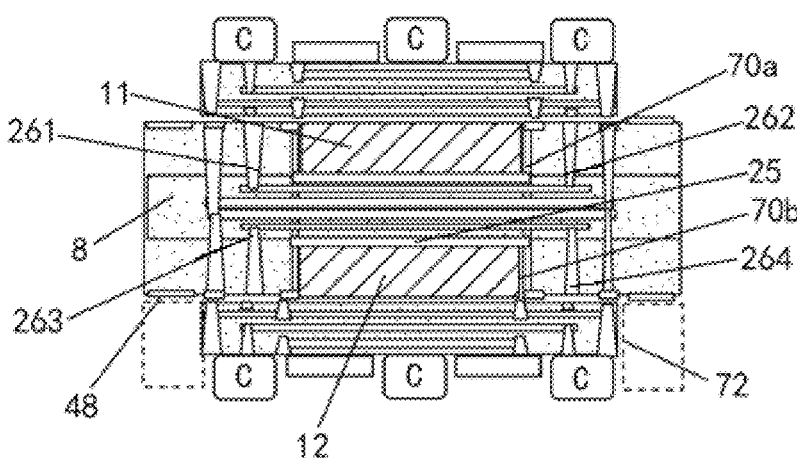
FIG. 16 is a schematic structural view (I) of a power supply module in a fifth embodiment of the disclosure.
Figure 17:
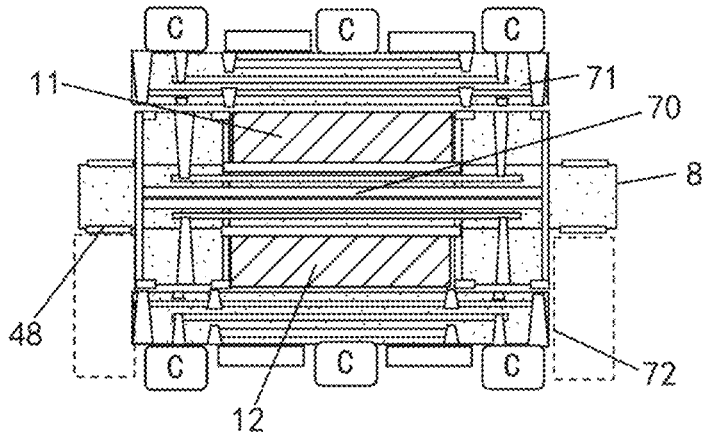
FIG. 17 is a schematic structural view (II) of the power supply module in the fifth embodiment of the disclosure.
Figure 18:
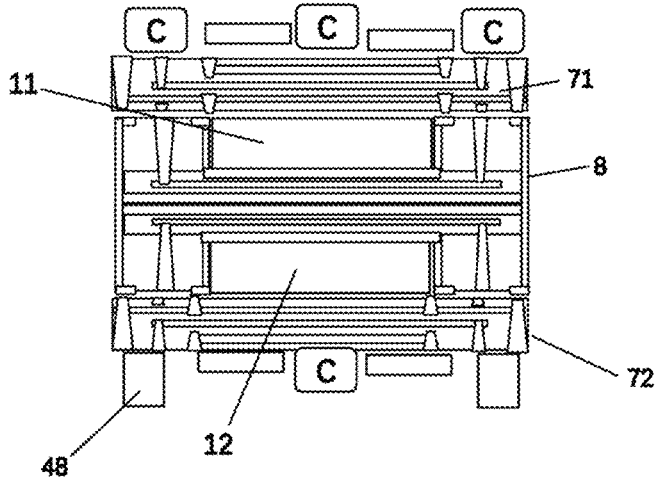
FIG. 18 is a schematic structural view (III) of the power supply module in the fifth embodiment of the disclosure.

Referring to FIGS. 16 to 18, FIG. 16 is a schematic structural view (I) of a power supply module in a fifth embodiment of the disclosure, FIG. 17 is a schematic structural view (II) of the power supply module in the fifth embodiment of the disclosure, and FIG. 18 is a schematic structural view (III) of the power supply module in the fifth embodiment of the disclosure. FIG. 5 can also be regarded as a top view of FIG. 16 or 17. In this embodiment, the power supply module is similar with the power supply modules provided in the above embodiments, and the same reference numerical indicates the same component, structure, and function, so the details are not described here. This embodiment differs from the fourth embodiment in that the first middle wiring layer 25, the first left electrical connection layer 261, the first right electrical connection layer 262, the second left electrical connection layer 263 and the second right electrical connection layer 264 are disposed on or in a fifth circuit board 70. The fifth circuit board 70 has a third groove 70a and a fourth groove 70b. The third groove 70a and the fourth groove 70b are on upper and lower sides of the fifth circuit board 70, and opposite to each other. The first left electrical connection layer 261 and the first right electrical connection layer 262 are at both sides of the third groove 70a. At least a part of the first middle wiring layer 25 is at a bottom of the third groove 70a. The second left electrical connection layer 263 and the second right electrical connection layer 264 are at both sides of the fourth groove 70b. At least a part of the first middle wiring layer 25 is at a bottom of the fourth groove 70b. The third groove 70a accommodates the first magnetic plate 11, and the fourth groove 70b accommodates the second magnetic plate 12. Referring to FIG. 17, FIG. 17 further illustrates that portions at left and right sides of the fifth circuit board 70 protruding out of the first upper circuit board 71 or the first lower circuit board 72 are manufactured to have the same thickness as part of the circuit board corresponding to the third groove 70a or the fourth groove 70b. As shown in FIG. 18, the fifth circuit board 70 can be aligned with the first upper circuit board 71 and the first lower circuit board 72. In such way, the first secondary winding can be formed using the way of surface electroplating, and the electrical connection layers formed by the way of vias is reduced, thereby better facilitating reducing conductive resistance, and facilitating reducing loss caused by skin effect and proximity effect due to parasitic inductance and the alternating current. Referring to FIG. 18 again, the copper block is disposed on the first lower circuit board 72 as the pins 48.

Figure 19A:
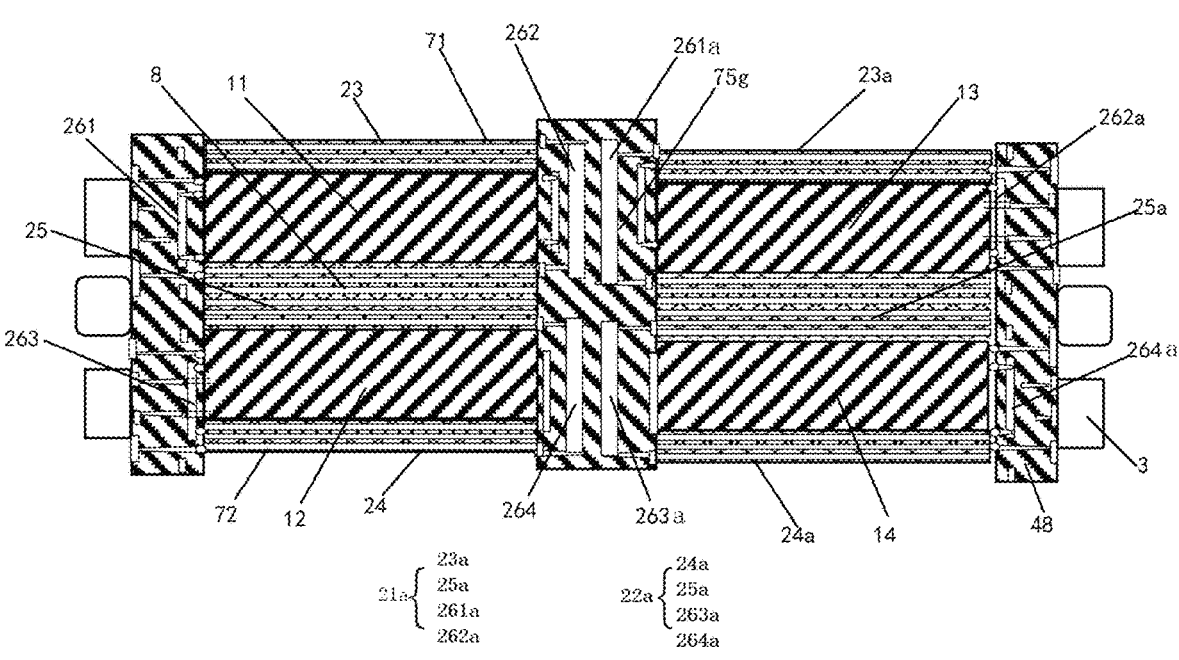
FIG. 19A is a schematic structural view (I) of a power supply module in a sixth embodiment of the disclosure.
Figure 19B:
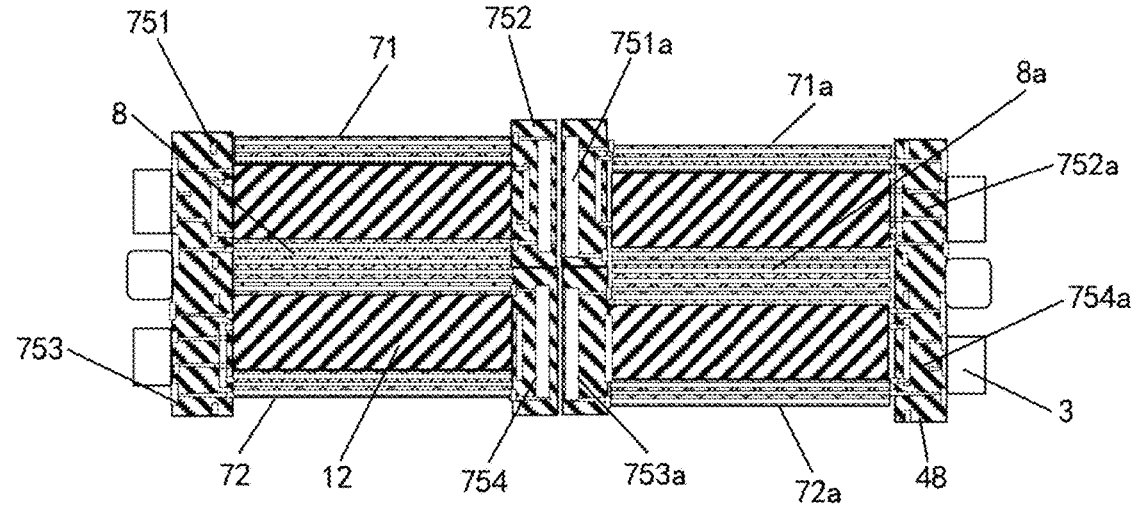
FIG. 19B is a schematic structural view (II) of the power supply module in the sixth embodiment of the disclosure.
Figure 19C:
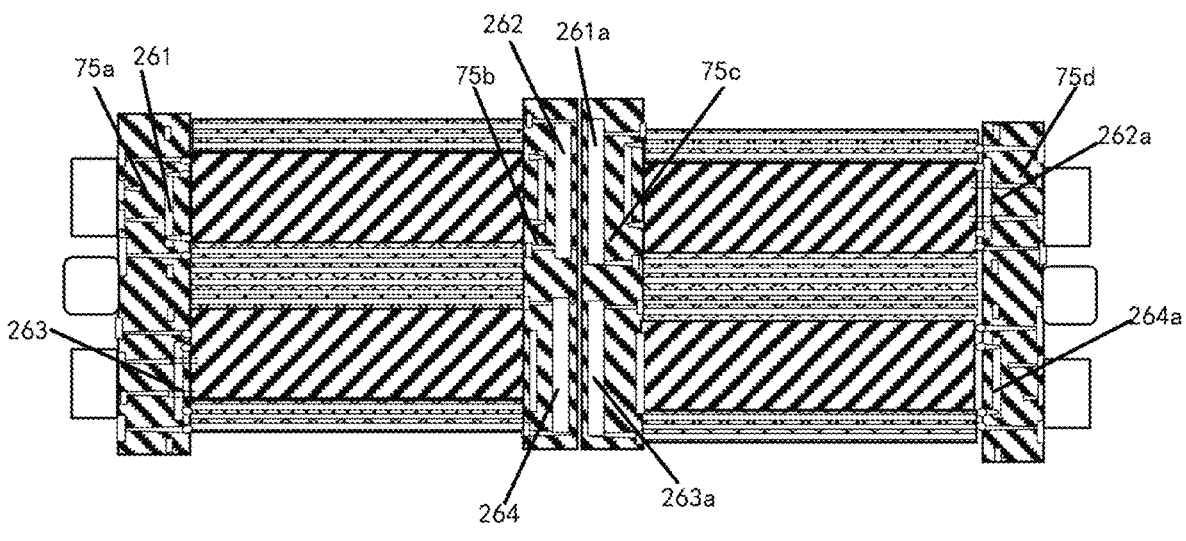
FIG. 19C is a schematic structural view (III) of the power supply module in the sixth embodiment of the disclosure.
Figure 19D:
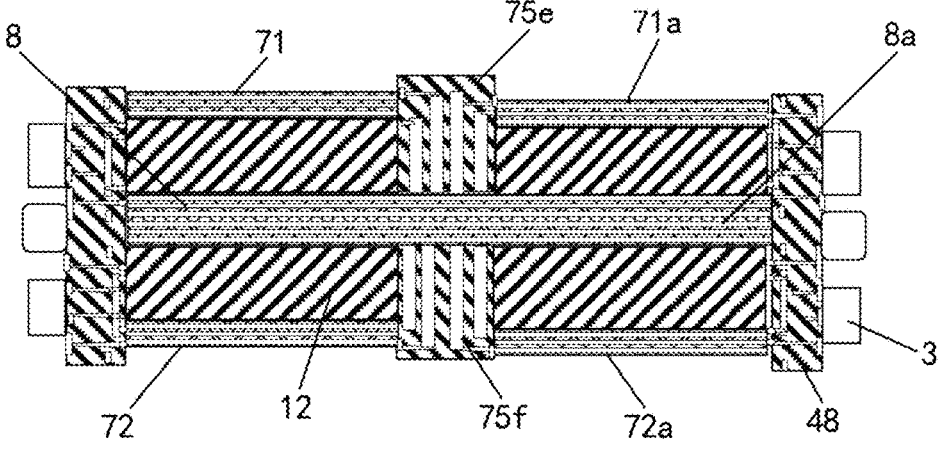
FIG. 19D is a schematic structural view (IV) of the power supply module in the sixth embodiment of the disclosure.
Figure 20:
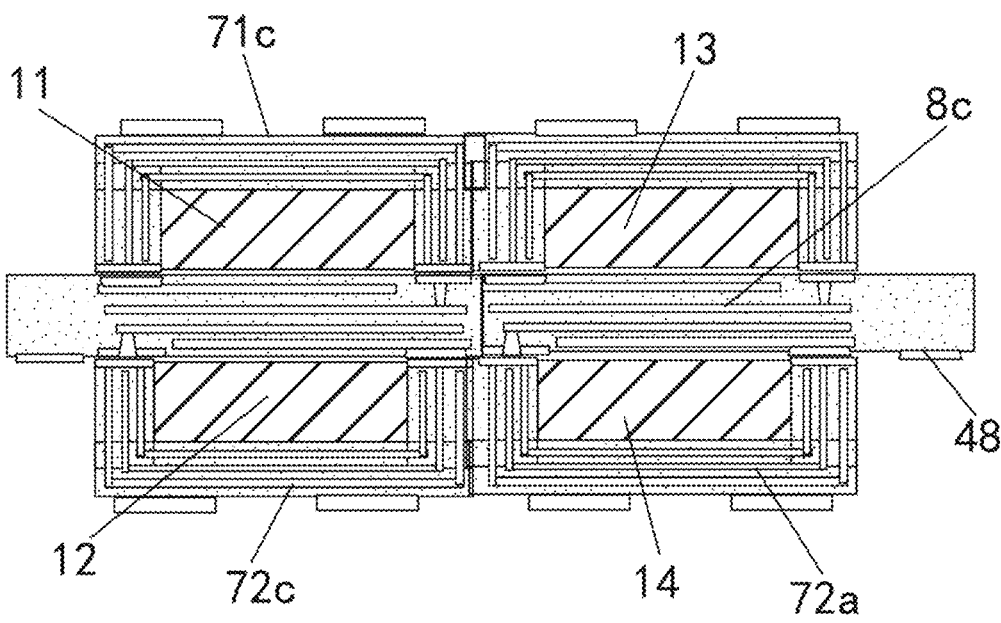
FIG. 20 is a schematic structural view (V) of the power supply module in the sixth embodiment of the disclosure.
Figure 21:
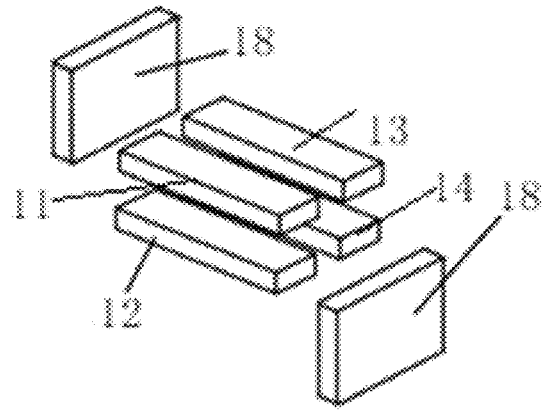
FIG. 21 is a perspective structural view of the power supply module in the sixth embodiment of the disclosure.
Figure 22:
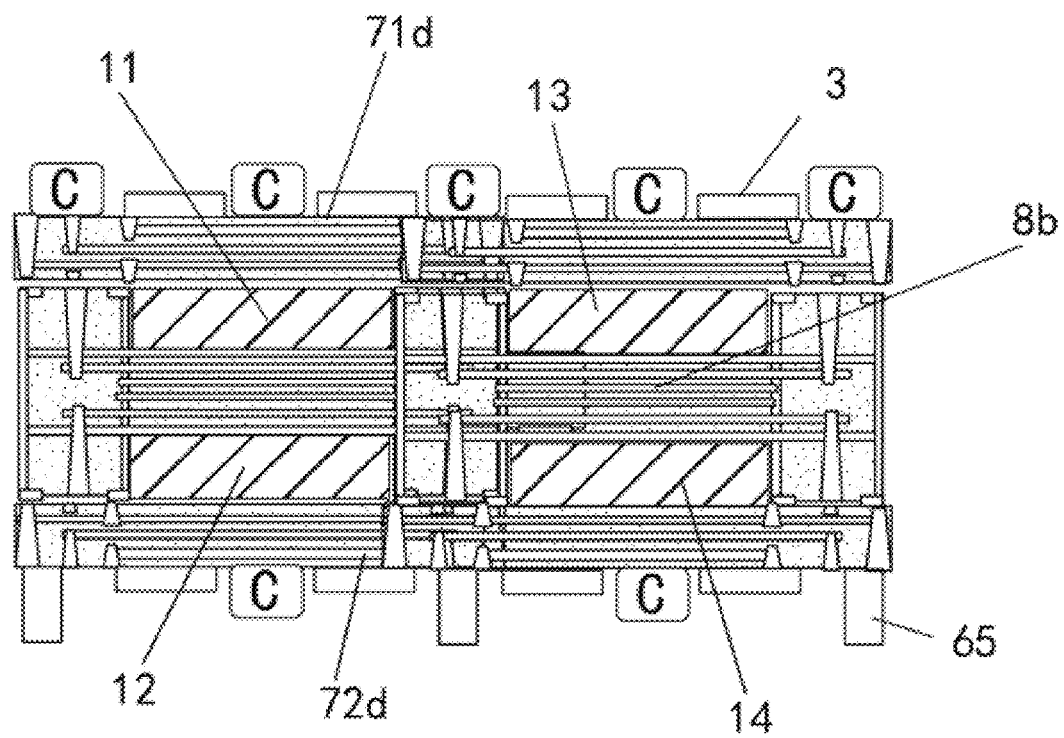
FIG. 22 is a schematic structural view (VI) of the power supply module in the sixth embodiment of the disclosure.

FIGS. 19A and 22 illustrate embodiments of the power supply module with a matrix magnetic plate structure. FIG. 19A is a schematic structural view (I) of a power supply module in a sixth embodiment of the disclosure, FIG. 19B is a schematic structural view (II) of the power supply module in the sixth embodiment of the disclosure, FIG. 19C is a schematic structural view (III) of the power supply module in the sixth embodiment of the disclosure, FIG. 19D is a schematic structural view (IV) of the power supply module in the sixth embodiment of the disclosure, FIG. 20 is a schematic structural view (V) of the power supply module in the sixth embodiment of the disclosure, FIG. 21 is a perspective structural view of the power supply module in the sixth embodiment of the disclosure, and FIG. 22 is a schematic structural view (VI) of the power supply module in the sixth embodiment of the disclosure. FIG. 21 illustrates a perspective structural view of a magnetic core of magnetic plates arranged in a matrix. The four magnetic plates are connected to magnetic covers 18 to form a magnetic loop, and the windings surround each magnetic plate. FIGS. 19A to 19D illustrate a power supply module with the four magnetic plates arranged in an array on the basis of the embodiment of FIG. 10. The power supply module is similar with the power supply modules provided in the above embodiments, and the same reference numerical indicates the same component, structure, and function, so the details are not described here. In this embodiment, the magnetic core further includes a third magnetic plate 13 and a fourth magnetic plate 14 stacked and at right side of the first magnetic plate 11 and the second magnetic plate 12. The power supply module further includes a second upper wiring layer 23a disposed above the third magnetic plate 13, a second lower wiring layer 24a disposed below the fourth magnetic plate 14, and a second middle wiring layer 25a disposed between the third magnetic plate 13 and the fourth magnetic plate 14. At least a part of the second upper wiring layer 23a and at least a part of the second middle wiring layer 25a are connected to form a third winding 21a surrounding the third magnetic plate 13, and at least a part of the second lower wiring layer 24a and at least a part of the second middle wiring layer 25a are connected to form a fourth winding 22a surrounding the fourth magnetic plate 14. The third winding 21a surrounds a fourth axis, the fourth winding 22a surrounds a fifth axis, and the fourth axis and the fifth axis are parallel to a surface of the power module where the pin is located.

As shown in FIG. 19A, the third winding 21a further includes a third left electrical connection layer 261a and a third right electrical connection layer 262a respectively at left and right sides of the third magnetic plate 13. The at least a part of the second upper wiring layer 23a, the third left electrical connection layer 261a, the at least a part of the second middle wiring layer 25a and the third right electrical connection layer 262a are sequentially connected to form the third winding 21a. The fourth winding 22a further includes a fourth left electrical connection layer 263a and a fourth right electrical connection layer 264a respectively at left and right sides of the fourth magnetic plate 14. The at least a part of the second middle wiring layer 25a, the fourth left electrical connection layer 263a, the at least a part of the second lower wiring layer 24a and the fourth right electrical connection layer 264a are sequentially connected to form the fourth winding 22a.

Referring to FIGS. 19B and 19A, the second upper wiring layer 23a is formed on or in a second upper circuit board 71a, the second lower wiring layer 24a is formed on or in a second lower circuit board 72a, and the second middle wiring layer 25a is formed on or in a second middle circuit board 8a. The third left electrical connection layer 261a is formed on or in a third left vertical circuit board 751a, the third right electrical connection layer 262a is formed on or in a third right vertical circuit board 752a, the fourth left electrical connection layer 263a is formed on or in a fourth left vertical circuit board 753a, and the fourth right electrical connection layer 264a is formed on or in a fourth right vertical circuit board 754a.

Referring to FIGS. 19C and 19A, the first left electrical connection layer 261 and the second left electrical connection layer 263 are disposed on or in a first circuit board 75a, the first right electrical connection layer 262 and the second right electrical connection layer 264 are disposed on or in a second circuit board 75b, the third left electrical connection layer 261a and the fourth left electrical connection layer 263a are disposed on or in a sixth circuit board 75c, and the third right electrical connection layer 262a and the fourth right electrical connection layer 264a are disposed on or in a seventh circuit board 75d.

Referring to FIGS. 19D and 19A, in this embodiment, the first right electrical connection layer 262 and the third left electrical connection layer 261a are disposed on or in an eighth circuit board 75e, and the second right electrical connection layer 264 and the fourth left electrical connection layer 263a are disposed on or in a ninth circuit board 75f.

Referring to FIG. 19A, the first right electrical connection layer 262, the second right electrical connection layer 264, the third left electrical connection layer 261a and the fourth left electrical connection layer 262a are disposed on or in a tenth circuit board 75g.

Referring to FIGS. 20 and 19A, the first left electrical connection layer 261, the first upper wiring layer 23, the first right electrical connection layer 262, the third left electrical connection layer 261a, the second upper wiring layer 23a and the third right electrical connection layer 262a are disposed on or in an eleventh circuit board 71c. The second left electrical connection layer 263, the first lower wiring layer 24, the second right electrical connection layer 264, the fourth left electrical connection layer 263a, the second lower wiring layer 24a and the fourth right electrical connection layer 264a are disposed on or in a twelfth circuit board 72c. The first middle wiring layer 25 and the second middle wiring layer 25a are disposed on or in a thirteenth circuit board 8c.

Referring to FIGS. 22 and 19A, the first upper wiring layer 23 and the second upper wiring layer 23a are disposed on or in a fourteenth circuit board 71d. The first left electrical connection layer 261, the first right electrical connection layer 262, the second left electrical connection layer 263, the second right electrical connection layer 264, the third left electrical connection layer 261a, the third right electrical connection layer 262a, the fourth left electrical connection layer 263a, the fourth right electrical connection layer 264a, the first middle wiring layer 25 and the second middle wiring layer 25a are disposed on or in a fifteenth circuit board 8b. The first lower wiring layer 24 and the second lower wiring layer 24a are disposed on or in a sixteenth circuit board 72d.

FIG. 22 illustrates that a copper block 65 is disposed on or in the sixteenth circuit board 72d to form pins of the power supply module. Similar to FIG. 16 or 17, both sides of the first middle circuit board 8 can also extend out to dispose the pins 48. The matrix magnetic plate structure facilitates improving power of the power supply module, improving efficiency by multiplexing the same magnetic flux and magnetic loop, and also may realize circuit multiplexing, thereby further improving efficiency, or facilitating arrangement of the switching devices, in particular, secondary rectifier devices, and facilitating reducing a length and loss of the winding. The structure of the array power supply module formed by the structure of the disclosure is more compact and simpler, and has a higher power density.

Figure 23:
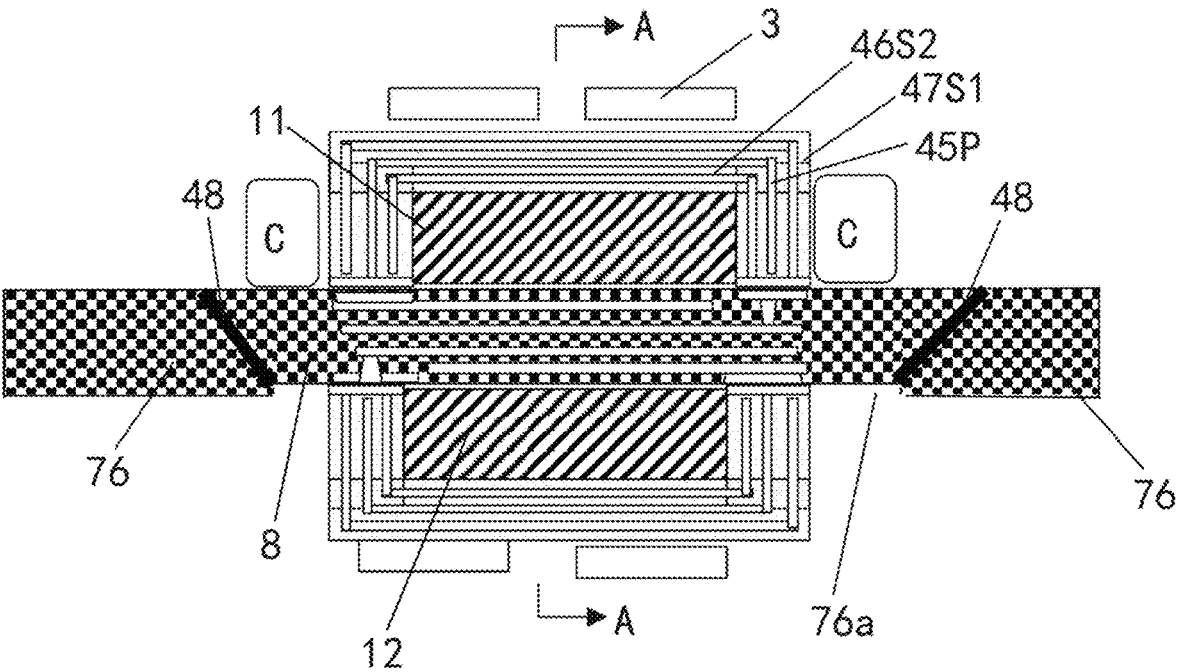
FIG. 23 is a schematic structural view of a power supply module in a seventh embodiment of the disclosure.

Referring to FIG. 23, FIG. 23 is a schematic structural view of a power supply module in a seventh embodiment of the disclosure. The power supply module in this embodiment is similar with the power supply modules provided in the above embodiments, and the same reference numerical indicates the same component, structure, and function, so the details are not described here. Specifically, what is different from the power supply module of FIG. 6 is that the power supply module in this embodiment has a plurality of pins 48 disposed on both inclined end surfaces of the first middle circuit board 8, and preferably, the pins are symmetric at left and right of the first middle circuit board 8. The middle wiring layer is disposed on or in the first middle circuit board 8. The first axis, the second axis and the third axis are parallel to a plane where the centers of the plurality of pins 48 are located.

In this embodiment, the pins 48 may be with a soldering pad structure, and solder balls can also be disposed at the soldering pads, thereby facilitating surface mounting and reflow soldering to the system board 76. A through groove can be set on the system board 76, corresponding inclined surfaces are disposed on end surfaces of the through groove, and the corresponding soldering pads of the power supply module are disposed on the inclined surfaces. In such way, the power supply module is soldered to the system board 76, and as compared to the way in FIG. 6A, the embodiment can realize an output path having more symmetric upper and lower windings, and better improve efficiency of the power supply module. In addition, a height of the power supply module on the system board 76 can be further reduced, and the first middle circuit board 8 can be embedded into the through groove of the system board 76, such that protruding heights of the power supply module from upper and lower surfaces of the system board 76 can be more symmetric, thereby better facilitating expansion for application. To sum up, the power supply module includes a first upper wiring layer, a first magnetic plate, a first middle wiring layer, a second magnetic plate, and a first lower wiring layer stacked sequentially. The magnetic plates and the magnetic covers form a magnetic loop. At least a part of the first upper wiring layer, the electrical connection layers and at least a part of the first middle wiring layer form a first winding. At least a part of the first lower wiring layer, the electrical connection layers and at least a part of the first middle wiring layer form a second winding. The windings in the wiring layers are formed by flat winding (where a width is larger than a thickness). The magnetic loop surrounds a first axis, the first winding and the second winding respectively surround a second axis and a third axis, and the first axis, the second axis and the third axis are parallel to a horizontal plane on which the pins of the power supply module are disposed. The switching devices are disposed on the first or second upper wiring layer, the first or second lower wiring layer or the electrical connection layers, and the electrical connection layers may be perpendicular to the upper wiring layer or the lower wiring layer, and are electrically connected to the upper wiring layer and the lower wiring layer. The power supply module disclosed by the disclosure at least obtains one of the following advantages: 1. when a height of the power supply module is compressed, the magnetic core and the winding can become thinner, and in the case that the magnetic loop and the winding become thinner, magnetic flux and current distribution therein are more even, thereby facilitating reducing a height of the module, and improving efficiency of the module; 2. with a three-dimensional arrangement structure for the windings, arrangement of the switching device (e.g., SR) and the winding is more flexible; 3. since the winding and the magnetic core are integrated by a three-dimensional way, the magnetic core and the winding are stacked, thereby facilitating realizing higher power density.

Figures 24A, 24B, 24C, 24D:
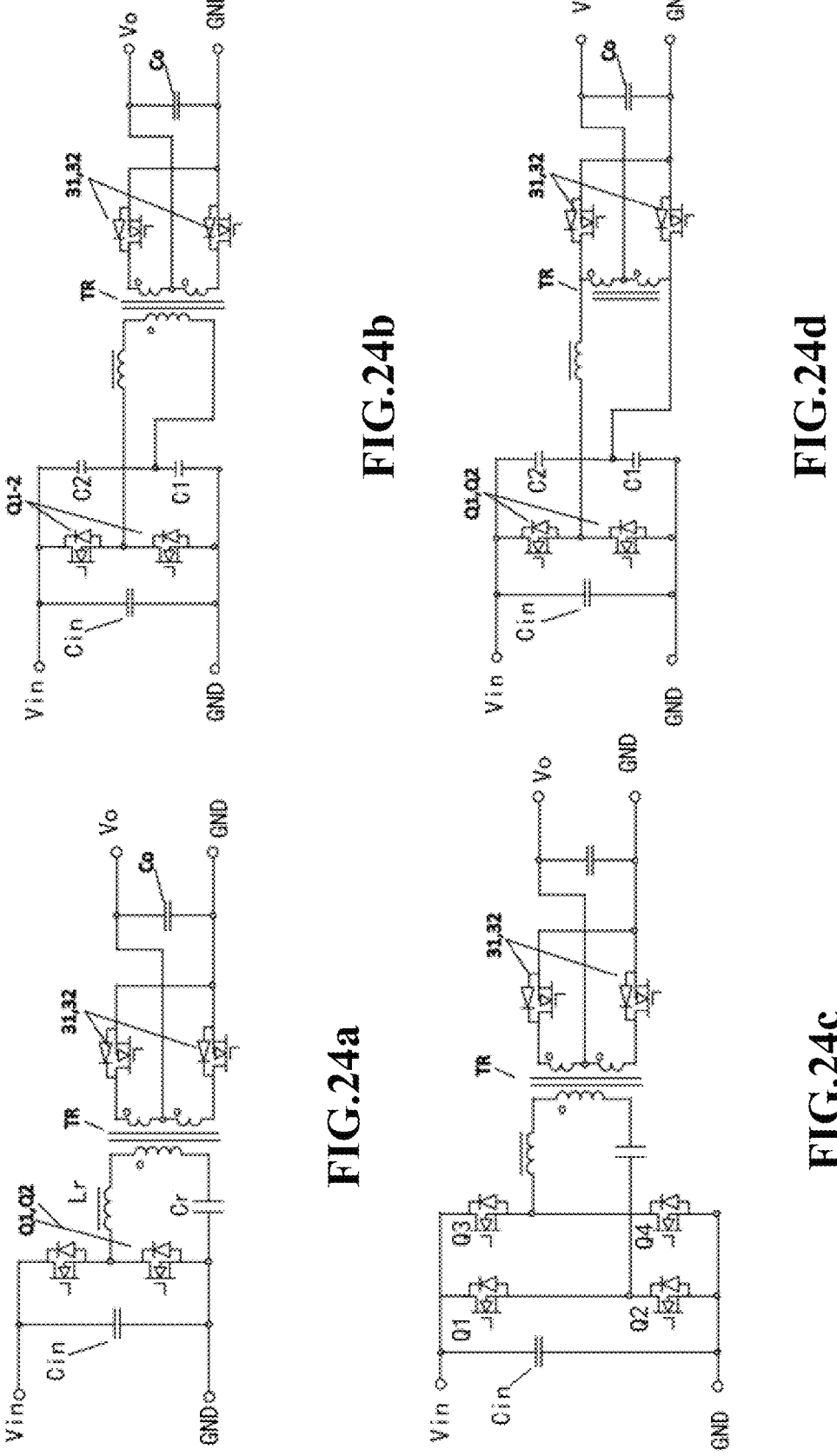
FIGS. 24a-24d are schematic diagrams of some typical application circuits.

FIGS. 24*a* to 24*d* are schematic diagrams of some typical application circuits. FIG. 24*a* shows a half-bridge DC-DC conversion circuit, FIG. 24*b* shows another type of half-bridge LLC circuit, FIG. 24*c* shows a full bridge LLC circuit, and FIG. 24*d* illustrates a LLC circuit with an autotransformer. In the drawings, 31 to 32 are rectifying elements, Q1 to Q4 are switching devices of a primary bridge circuit, TR is a transformer (a magnetic element), Co is an output capacitor, Cin is an input capacitor, Lr is a resonant inductor, and Cr is a resonant capacitor. Vin is an input voltage, Vo is an output positive electrode, and GND is an output negative electrode. In addition, the structure of the disclosure can also be applied to a Cuk circuit or a flyback circuit.

Although the disclosure has been disclosed in the embodiments, the disclosure is not limited thereto. Any skilled in the art shall make various changes and modifications without departing from spirit and scope of the disclosure, so the protection scope of the disclosure shall be determined by the scope defined by the appended claims.

What is claimed is:

1. A power supply module, comprising:
   a pin;
   a magnetic core, comprising:
   a first magnetic plate; and
   a second magnetic plate below the first magnetic plate, and parallel to the first magnetic plate, the first magnetic plate and the second magnetic plate forming a magnetic loop;
   a first upper wiring layer disposed above the first magnetic plate;
   a first middle wiring layer disposed between the first magnetic plate and the second magnetic plate;
   a first lower wiring layer disposed below the second magnetic plate, wherein at least a part of the first upper wiring layer and at least a part of the first middle wiring layer are connected to form a first winding surrounding the first magnetic plate, at least a part of the first lower wiring layer and at least a part of the first middle wiring layer are connected to form a second winding surrounding the second magnetic plate, and the magnetic core, the first winding and the second winding form a magnetic element; and
   a switch electrically connected to the magnetic element, wherein the magnetic loop surrounds a first axis, the first winding surrounds a second axis, the second winding surrounds a third axis, and the first axis, the second axis and the third axis are parallel to a surface of the power module where the pin is located.

2. The power supply module according to claim 1, wherein the first winding further comprises a first left electrical connection layer and a first right electrical connection layer respectively at left side and right side of the first magnetic plate, the at least a part of the first upper wiring layer, the first left electrical connection layer, the at least a part of the first middle wiring layer and the first right electrical connection layer are sequentially connected to form the first winding, the second winding further comprises a second left electrical connection layer and a second right electrical connection layer respectively at left side and right side of the second magnetic plate, and the at least a part of the first middle wiring layer, the second left electrical connection layer, the at least a part of the first lower wiring layer and the second right electrical connection layer are sequentially connected to form the second winding.

3. The power supply module according to claim 2, wherein the first left electrical connection layer, the first right electrical connection layer, the second left electrical connection layer and the second right electrical connection layer are conductive vias.

4. The power supply module according to claim 2, wherein the first upper wiring layer is disposed on or in a first upper circuit board, the first lower wiring layer is disposed on or in a first lower circuit board, and the first middle wiring layer is disposed on or in a first middle circuit board; the first left electrical connection layer is disposed on or in a first left vertical circuit board, the first right electrical connection layer is disposed on or in a first right vertical circuit board, the second left electrical connection layer is disposed on or in a second left vertical circuit board, the second right electrical connection layer is disposed on or in a second right vertical circuit board, and the first upper circuit board, the first middle circuit board and the first lower circuit board are parallel to the first magnetic plate.

5. The power supply module according to claim 2, wherein the first left electrical connection layer and the second left electrical connection layer are disposed on or in a first circuit board, and the first right electrical connection layer and the second right electrical connection layer are disposed on or in a second circuit board.

6. The power supply module according to claim 2, wherein the first upper wiring layer, the first left electrical connection layer and the first right electrical connection layer are disposed on or in a third circuit board, the third circuit board has a first groove for accommodating the first magnetic core, the first lower wiring layer, the second left electrical connection layer and the second right electrical connection layer are disposed on or in a fourth circuit board, the fourth circuit board has a second groove for accommodating the second magnetic core, and openings of both the first groove and the second groove face the first middle wiring layer.

7. The power supply module according to claim 6, wherein an external surface of the third circuit board and internal surfaces of the first groove and the second groove are electroplated with a metal.

8. The power supply module according to claim 2, wherein the first middle wiring layer, the first left electrical connection layer, the first right electrical connection layer, the second left electrical connection layer and the second right electrical connection layer are disposed on or in a fifth circuit board, the fifth circuit board has a third groove and a fourth groove respectively on upper and lower sides of the fifth circuit board, the third groove accommodates the first magnetic core, and the fourth groove accommodates the second magnetic core.

9. The power supply module according to claim 2, wherein, the first upper wiring layer is disposed on or in a first upper circuit board, the first lower wiring layer is disposed on or in a first lower circuit board, the first middle wiring layer is disposed on or in a first middle circuit board, the first upper circuit board, the first middle circuit board and the first lower circuit board are parallel to the first magnetic plate, and each of the first upper circuit board, the first middle circuit board and the first lower circuit board comprises a first end and a second end, the first ends of the first upper circuit board, the first middle circuit board and the first lower circuit board are aligned with each other, the second ends of the first upper circuit board, the first middle circuit board and the first lower circuit board are aligned with each other, the first left electrical connection layer and the second left electrical connection layer are disposed on or in a first circuit board in contact with the first ends of the first upper circuit board, the first middle circuit board and the first lower circuit board, and the first right electrical connection layer and the second right electrical connection layer are disposed on or in a second circuit board in contact with the second ends of the first upper circuit board, the first middle circuit board and the first lower circuit board.

10. The power supply module according to claim 3, wherein both ends of the first middle circuit board protrude out of the first left vertical circuit board and the first right vertical circuit board, respectively, and the pin is disposed on a lower surface of both ends of the first middle circuit board, or the pin is formed on a lower surface of a copper block disposed on a lower surface of both ends of the first middle circuit board.

11. The power supply module according to claim 3, wherein both ends of the first middle circuit board protrude out of the first left vertical circuit board and the first right vertical circuit board, respectively, the pin is disposed on a lower surface of both ends of the first middle circuit board, a load is disposed on a system board, the power supply module is configured to power the load, and the system board is provided with a through groove into which the second left vertical circuit board, the second right vertical circuit board and the second magnetic plate are embedded, and the first middle circuit board is electrically connected to the system board.

12. The power supply module according to claim 1, wherein the magnetic core further comprises a first magnetic cover, a second magnetic cover, a third magnetic cover and a fourth magnetic cover, the first magnetic cover and the second magnetic cover are disposed respectively on a front side surface and a rear side surface of the first magnetic plate, the third magnetic cover and the fourth magnetic cover are disposed respectively on a front side surface and a rear side surface of the second magnetic plate, end surfaces of the first magnetic cover, the second magnetic cover, the third magnetic cover and the fourth magnetic cover are inclined surfaces, an inclined first air gap is formed between the first magnetic cover and the third magnetic cover, and an inclined second air gap is formed between the second magnetic cover and the fourth magnetic cover.

13. The power supply module according to claim 1, wherein the magnetic core further comprises a third magnetic plate and a fourth magnetic plate stacked, the third magnetic plate and the fourth magnetic plate are at right side of the first magnetic plate and the second magnetic plate, and the power supply module further comprises:

a second upper wiring layer disposed above the third magnetic plate;

a second middle wiring layer disposed between the third magnetic plate and the fourth magnetic plate; and a second lower wiring layer disposed below the fourth magnetic plate, wherein at least a part of the second upper wiring layer and at least a part of the second middle wiring layer are connected to form a third winding surrounding the third magnetic plate, at least a part of the second lower wiring layer and at least a part of the second middle wiring layer are connected to form a fourth winding surrounding the fourth magnetic plate, the third winding surrounds a fourth axis, the fourth winding surrounds a fifth axis, and the fourth axis and the fifth axis are parallel to the surface of the power module where the pin is located.

14. The power supply module according to claim 13, wherein the third winding further comprises a third left electrical connection layer and a third right electrical connection layer respectively at left and right sides of the third magnetic plate, the at least a part of the second upper wiring layer, the third left electrical connection layer, the at least a part of the second middle wiring layer and the third right electrical connection layer are sequentially connected to form the third winding, the fourth winding further comprises a fourth left electrical connection layer and a fourth right electrical connection layer respectively at left and right sides of the fourth magnetic plate, and the at least a part of the second middle wiring layer, the fourth left electrical connection layer, the at least a part of the second lower wiring layer and the fourth right electrical connection layer are sequentially connected to form the fourth winding.

15. The power supply module according to claim 14, wherein the second upper wiring layer is formed on or in a second upper circuit board, the second lower wiring layer is formed on or in a second lower circuit board, and the second middle wiring layer is formed on or in a second middle circuit board; the third left electrical connection layer is formed on or in a third left vertical circuit board, the third right electrical connection layer is formed on or in a third right vertical circuit board, the fourth left electrical connection layer is formed on or in a fourth left vertical circuit board, and the fourth right electrical connection layer is formed on or in a fourth right vertical circuit board.

16. The power supply module according to claim 14, wherein the first left electrical connection layer and the second left electrical connection layer are disposed on or in a first circuit board, the first right electrical connection layer and the second right electrical connection layer are disposed on or in a second circuit board, the third left electrical connection layer and the fourth left electrical connection layer are disposed on or in a sixth circuit board, and the third right electrical connection layer and the fourth right electrical connection layer are disposed on or in a seventh circuit board.

17. The power supply module according to claim 14, wherein the first right electrical connection layer and the third left electrical connection layer are disposed on or in an eighth circuit board, and the second right electrical connection layer and the fourth left electrical connection layer are disposed on or in a ninth circuit board.

18. The power supply module according to claim 14, wherein the first right electrical connection layer, the second right electrical connection layer, the third left electrical connection layer and the fourth left electrical connection layer are disposed on or in a tenth circuit board.

19. The power supply module according to claim 14, wherein the first left electrical connection layer, the first upper wiring layer, the first right electrical connection layer, the third left electrical connection layer, the second upper wiring layer and the third right electrical connection layer are disposed on or in an eleventh circuit board, the second left electrical connection layer, the first lower wiring layer, the second right electrical connection layer, the fourth left electrical connection layer, the second lower wiring layer and the fourth right electrical connection layer are disposed on or in a twelfth circuit board, and the first middle wiring layer and the second middle wiring layer are disposed on or in a thirteenth circuit board.

20. The power supply module according to claim 14, wherein the first upper wiring layer and the second upper wiring layer are disposed on or in a fourteenth circuit board, the first left electrical connection layer, the first right electrical connection layer, the second left electrical connection layer, the second right electrical connection layer, the third left electrical connection layer, the third right electrical connection layer, the fourth left electrical connection layer, the fourth right electrical connection layer, the first middle wiring layer and the second middle wiring layer are disposed on or in a fifteenth circuit board, and the first lower wiring layer and the second lower wiring layer are disposed on or in a sixteenth circuit board.

21. The power supply module according to claim 3, wherein the first upper circuit board, the first left vertical circuit board and the first right vertical circuit board are integrated into a flexible circuit board; and the first lower circuit board, the second left vertical circuit board and the second right vertical circuit board are integrated into another flexible circuit board.

22. The power supply module according to claim 2, wherein the first upper wiring layer and the first middle wiring layer both have multiple layers, at least a part of the first upper wiring layer and at least a part of the first middle wiring layer are connected to form a fifth winding, the first winding is a primary winding of the magnetic element, and the fifth winding is a first secondary winding of the magnetic element.

23. The power supply module according to claim 22, wherein at least a part of the first upper wiring layer and at least a part of the first middle wiring layer are connected to form a sixth winding, the sixth winding is a second secondary winding of the magnetic element, and at least a part of the primary winding is between at least a part of the first secondary winding and at least a part of the second secondary winding.

24. The power supply module according to claim 2, wherein the first upper wiring layer, the first left electrical connection layer and the first right electrical connection layer are disposed on or in a third circuit board, the third circuit board has a first groove for accommodating the first magnetic core, and an external surface of the third circuit board and an internal surface of the groove are electroplated with a metal.

25. A power supply module, comprising:

a plurality of pins;

a magnetic core, comprising:

a first magnetic plate; and a second magnetic plate below the first magnetic plate and parallel to the first magnetic plate, the first magnetic plate and the second magnetic plate forming a magnetic loop;

a first upper wiring layer disposed above the first magnetic plate;

a first middle wiring layer disposed between the first magnetic plate and the second magnetic plate;

a first lower wiring layer disposed below the second magnetic plate, wherein at least a part of the first upper wiring layer and at least a part of the first middle wiring layer are connected to form a first winding surrounding the first magnetic plate, at least a part of the first lower wiring layer and at least a part of the first middle wiring layer are connected to form a second winding surrounding the second magnetic plate, and the magnetic core, the first winding and the second winding form a magnetic element; and a switch electrically connected to the magnetic element, wherein the magnetic loop surrounds a first axis, the first winding surrounds a second axis, the second winding surrounds a third axis, the first axis, the second axis and the third axis are parallel to a plane where centers of the plurality of pins are located, the middle wiring layer is disposed on or in a first middle circuit board, and the plurality of pins are disposed on both inclined end surfaces of the first middle circuit board.

* * * * *